United States Patent
Suzuki et al.

(10) Patent No.: US 6,376,939 B1
(45) Date of Patent: Apr. 23, 2002

(54) SENSOR APPARATUS AND SAFETY APPARATUS FOR PROTECTING APPROACH TO MACHINES

(75) Inventors: Takashi Suzuki, Niihama; Ichirou Washizaki, Ichihara; Shigeo Umezaki, Tokorozawa, all of (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/541,600

(22) Filed: Apr. 3, 2000

(30) Foreign Application Priority Data

Apr. 2, 1999 (JP) .......................................... 11-096550

(51) Int. Cl.⁷ .............................................. H02H 1/00
(52) U.S. Cl. ...................... 307/326; 307/116; 307/328; 361/181; 340/562; 327/517
(58) Field of Search ................................ 307/109, 116, 307/326, 320; 361/181; 340/562, 870.37; 327/517; 324/687

(56) References Cited

U.S. PATENT DOCUMENTS

| | | | | |
|---|---|---|---|---|
| 3,829,850 A | * | 8/1974 | Guetersloh | 340/258 C |
| 3,886,413 A | * | 5/1975 | Dow et al. | 317/123 |
| 4,518,958 A | | 5/1985 | Cook et al. | 340/679 |
| 5,166,679 A | * | 11/1992 | Varnish et al. | 340/870.37 |

FOREIGN PATENT DOCUMENTS

| | | | |
|---|---|---|---|
| EP | 0 341 576 | 11/1989 | |
| JP | 63-216692 | 9/1988 | ............ B25J/19/06 |
| JP | 1-317987 | 12/1989 | ............ B66B/31/00 |

OTHER PUBLICATIONS

English Abstract of Japanese Patent Application No. JP 10–048344A, retrieved on Feb. 7, 2000.

* cited by examiner

Primary Examiner—Josie Ballato
Assistant Examiner—Robert L. Deberadinis
(74) Attorney, Agent, or Firm—Sughrue Mion, PLLC

(57) ABSTRACT

A sensor apparatus and a safety apparatus which can ensure significantly enhanced safety by monitoring constantly whether the sensor apparatus is operating normally. An auxiliary electrode plate of a small area is disposed in parallel and in opposition to an electrode plate with a short distance therefrom. A switching element is turned on every second for a period of milliseconds repetitively. When the switching element is turned on under the control of a central processing unit, the auxiliary electrode plate is connected to the ground potential, as a result of which a capacitance $\Delta C$ effective between the auxiliary electrode plate and the electrode plate is electrically connected in parallel with a capacitor $C_0$ effective between the electrode plate and a machine component, resulting in that the capacitance $C_0$ is increased by a proportion corresponding to the capacitance $\Delta C$. Consequently, change of the capacitance $C_0$ comparable to that brought about upon detection of the human body takes place, whereby a substantially similar detection signal as the human body detection signal is made available. On the basis of this detection signal, it is possible to monitor whether or not the sensor apparatus is operating normally.

6 Claims, 18 Drawing Sheets

SENSOR APPARATUS AND SAFETY APPARATUS FOR PROTECTING APPROACH TO MACHINES

BACKGROUND OF THE INVENTION

1. Field of the Invention

The present invention relates to a sensor apparatus for detecting whether a part or a whole of the human body or the like has accessed or entered a predetermined area of a machine concerned. Further, the present invention relates to a safety apparatus implemented by making use of the sensor apparatus for In ensuring protection for the human body or a part thereof approaching a risky area or region of the machine. More particularly, the present invention is concerned with an apparatus for monitoring normality of operation of the sensor apparatuses.

2. Description of Related Art

Among the machines such as exemplified by machine tools, processing/finishing machines, inspection apparatuses, transport mechanisms and the like, there exist such type of machine in which a driving mechanism therefor is exposed to the exterior or easily accessible from the exterior. By way of example, in a rolling mill or machine designed for manufacturing a thin specimen from a plastic chip, such a structure is adopted that the chip is thrown into a gap between a pair of reduction rolls manually by a worker or operator. Consequently, there may undesirably arise such situation that a hand of the operator contacts inadvertently the reduction roll upon charging of the chip into the gap between the rolls.

Under the circumstances, the machine of this sort is ordinarily equipped with a safety apparatus for ensuring safety for the operator. To this end, a sensor apparatus for detecting approach or access of a part of the human body or the like is made use of in the safety apparatus for stopping a driving system for the machine when such access entails danger for the human body.

As the sensor apparatus for the safety apparatus known heretofore, there can be mentioned those disclosed, for example, in Japanese Patent Application Laid-Open Publication Nos. 216692/1988 and 317987/1989 (JP-A-63-216692 and JP-A-1-317987). The sensor apparatus disclosed in these publications is comprised of a pair of electrode plates disposed in opposition to each other.

In the sensor apparatuses mentioned above, change of the capacitance making appearance between the electrode plates is monitored for thereby detecting whether a part of the human body enters or moves through and across the space defined between the electrode plates. In this conjunction, it is noted that the human body has a dielectric constant or permittivity which is considerably larger than that of the air. By taking advantage of such difference in the permittivity between the human body and the air, a capacitance type sensor apparatus is implemented on the basis of the fact that a significant change takes place in the capacitance effective between the electrode plates when a part of the human body is positioned between the electrode plates.

SUMMARY OF THE INVENTION

The safety apparatus implemented by adopting the capacitance type sensor mentioned above is indispensably required in order to ensure the safety for the worker or operator. However, such safety apparatus may suffer not a few troubles such as disconnection or breakage of electric conductors, injury and drop-off of electrodes, interruption of electric power supply and the like. Besides, the safety apparatus may undergo adverse influence of the environmental conditions such as change of the ambient electromagnetic field, abnormal rise of the ambient temperature and the like. In that case, abnormal operation of the safety apparatus can take place due to erroneous operation of the capacitance type sensor apparatus, necessitating thus appropriate measures such as shutdown of operation of the driving mechanism for the machine concerned to be taken in order to evade unforecastable accidents. Since occurrence of such troubles and the erroneous operation can not be predicted, operation of the capacitance type sensor apparatus and hence that of the safety apparatus have to be monitored constantly and continuously.

In the light of the state of the art described above, it is an object of the present invention to provide a sensor apparatus and a safety apparatus which are capable of monitoring constantly whether the sensor apparatus is operating normally, to thereby ensure an enhanced safety.

In view of the above and other objects which will become apparent as the description proceeds, there is provided according to an aspect of the present invention a sensor apparatus for a machine grounded electrically, which apparatus includes at least one electrode plate disposed relative to the machine with a predetermined space therefrom, an auxiliary electrode disposed in opposition to a portion of the electrode plate, a capacitance change detecting circuit for detecting whether a predetermined dielectric exists or not within the predetermined space on the basis of change of capacitance effective between the electrode plate and the machine, and a monitoring unit for monitoring normality of dielectric detecting operation of the sensor apparatus by electrically connecting periodically the auxiliary electrode plate to the capacitance change detecting circuit.

According to another aspect of the present invention, there is provided a safety apparatus for detecting entrance of at least a part of human body in a predetermined area of a machine grounded electrically for activating safety securing measures. The safety apparatus includes at least one electrode plate disposed relative to the machine with the predetermined area being interposed between the machine and the electrode plate, an auxiliary electrode disposed in opposition to a portion of the electrode plate, a capacitance change detecting circuit for detecting whether a part of the human body exists or not in the predetermined area on the basis of change of capacitance between the electrode plate and the machine, and a monitoring unit for monitoring normality of human body detecting operation of the sensor apparatus by electrically connecting periodically the auxiliary electrode to the capacitance change detecting circuit.

With the structures of the sensor apparatus and the safety apparatus described above, it is possible to monitor constantly with the aid of the auxiliary electrode whether the operation for detecting presence of a dielectric such as the human body or the like is being carried out normally. By virtue of this feature, occurrence of trouble in the sensor/safety apparatus can instantaneously be detected, whereupon proper safety measures such as emergency shutdown of operation of the machine equipped with the sensor/safety apparatus can be validated. Thus, the safety enhanced significantly can be ensured. Besides, because the sensor apparatus and the safety apparatus according to the present invention are implemented as based on the scheme of monitoring the normality of operations of the apparatus by detecting change of electrostatic capacitance, erroneous operation of the sensor apparatus due to variations of the environmental conditions such as the environmental electromagnetic field and the ambient temperature can instantaneously be detected in terms of change of the capacitance, allowing thus the proper measures to be taken immediately, advantageously for ensuring the safety with high reliability.

In a preferred mode for carrying out the invention, the sensor apparatus should further include a guard plate disposed at a rear side of the electrode plate and a shielding plate disposed at a rear side of the guard plate. Owing to such arrangement, no electric field is formed on or along the rear surface of the electrode plate. Thus, the detecting area can be limited to the space defined between the electrode plates. Thus, the possibility of erroneous detection is mitigated or suppressed, whereby the safety apparatus can be operated only within the prescribed range with high reliability, to great advantage.

According to yet another aspect of the present invention, there is provided a sensor apparatus which includes a pair of electrode plates disposed in opposition to each other with a predetermined space being interposed therebetween, an auxiliary electrode disposed in opposition to a portion of either one of the electrode plates, a capacitance change detecting circuit for detecting whether a predetermined dielectric exists or not within the space on the basis of change of capacitance effective between the pair of electrode plates, and a monitoring unit for monitoring normality of dielectric detecting operation of the sensor apparatus by electrically connecting periodically the auxiliary electrode to the capacitance change detecting circuit.

Furthermore, according to still another aspect of the present invention, there is provided a safety apparatus for detecting entrance of at least a part of human body in a predetermined area of a machine grounded electrically, to thereby activate safety securing measures upon detection of the human body. The safety apparatus includes a pair of electrode plates disposed in opposition to each other with the above-mentioned area being interposed between the pair of electrode plates, an auxiliary electrode disposed in opposition to a portion of either one of the electrode plates, a capacitance change detecting circuit for detecting whether at least a part of the human body exists or not in the area mentioned above on the basis of change of capacitance effective between the pair of electrode plates, and a monitoring unit for monitoring normality of human body detecting operation of the sensor apparatus by electrically connecting periodically the auxiliary electrode to the capacitance change detecting circuit.

With the structures of the sensor apparatus and safety apparatus described above, normality of the operation for detecting presence of the human body or a part thereof in the risky area of the machine concerned is monitored periodically with the aid of the auxiliary electrode plate. Thus, occurrence of troubles can instantaneously be detected as well, whereby the safety can further be enhanced.

In a preferred mode for carrying out the present invention, the sensor apparatus may further include a pair of shielding plates grounded electrically and disposed, respectively, in opposition to the pair of electrode plates at sides opposite to the space defined between the electrode plates. By virtue of such arrangement, no electromagnetic field is formed on and along the rear surfaces of the electrode plates owing to the provision of the shielding plates, which contributes to prevention of erroneous detection more positively, to another great advantage.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE EMBODIMENTS

Figure 1:
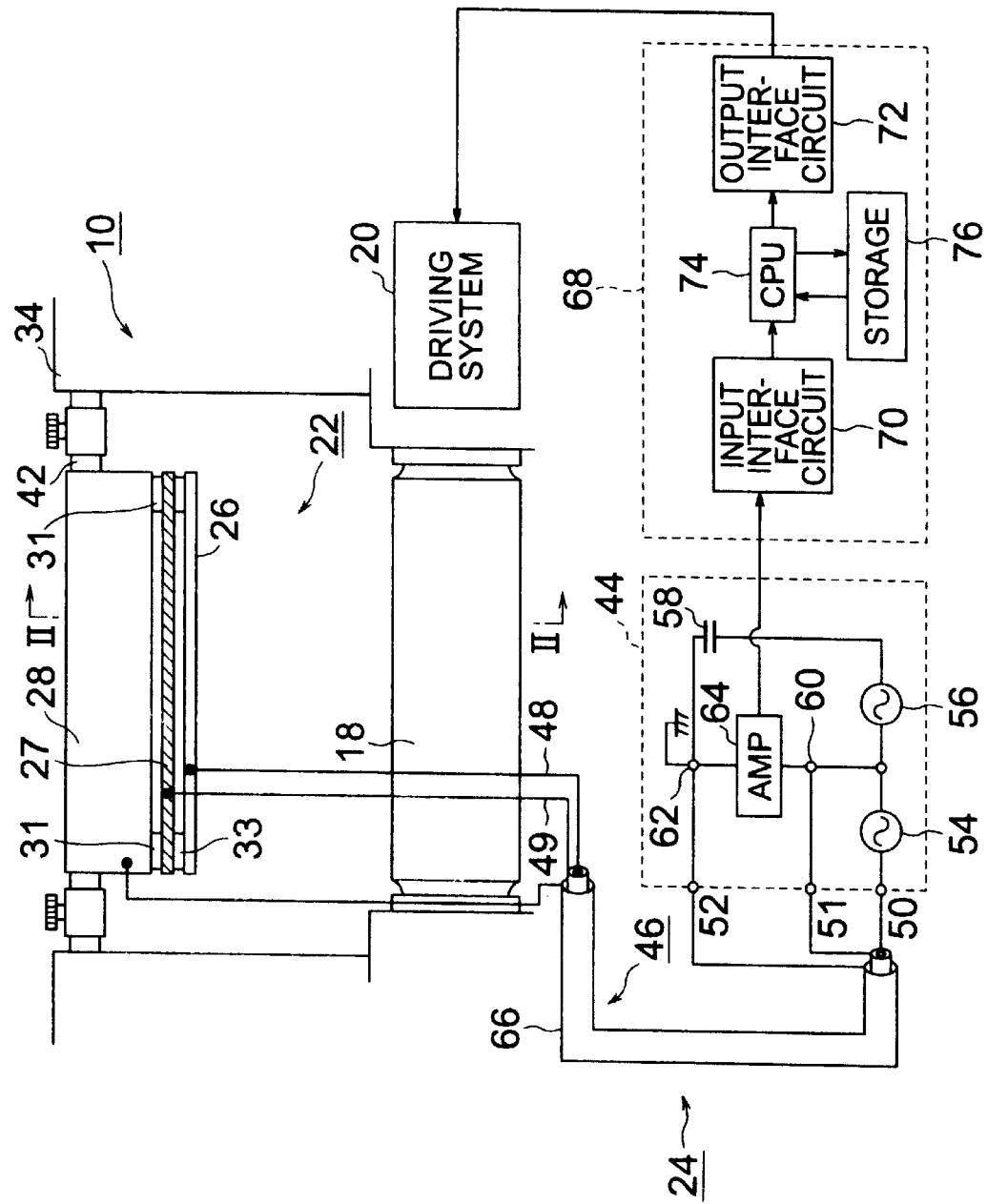
FIG. 1 is a view showing schematically a structure of a ground-electrode capacitance type sensor apparatus and a safety apparatus for a rolling machine in the state in which an auxiliary electrode according to the invention is not installed.

The present invention will be described in detail in conjunction with what is presently considered as preferred or typical embodiments thereof by reference to the drawings. In the following description, like reference characters designate like or corresponding parts throughout the several views. As the sensor/safety apparatuses to which the present invention can find application, there can be conceived three types of sensor apparatuses, i.e., the ground-electrode capacitance type, the inter-electrode capacitance type and the inter-electrode/ground-electrode capacitance type. In the following description, these three types of the sensor apparatuses will first be elucidated with regard to the structure and operation thereof for facilitating understanding of the present invention. Subsequently, description will be directed to the monitoring apparatus which is provided according to the teachings of the present invention for the purpose of monitoring whether the sensor apparatus is operating normally or not. Further, in the following, the present invention will be described on the assumption that the teachings of the invention is applied to the sensor/safety apparatuses for a rolling mill or machine. However, this is only by way of example, and the invention is never restricted thereto. It should be appreciated that the sensor/safety apparatus incarnating the present invention can be employed in combination with other various apparatuses, machines, instruments, equipment and the like for the purpose of ensuring safety for the attendant persons.

Figure 2:
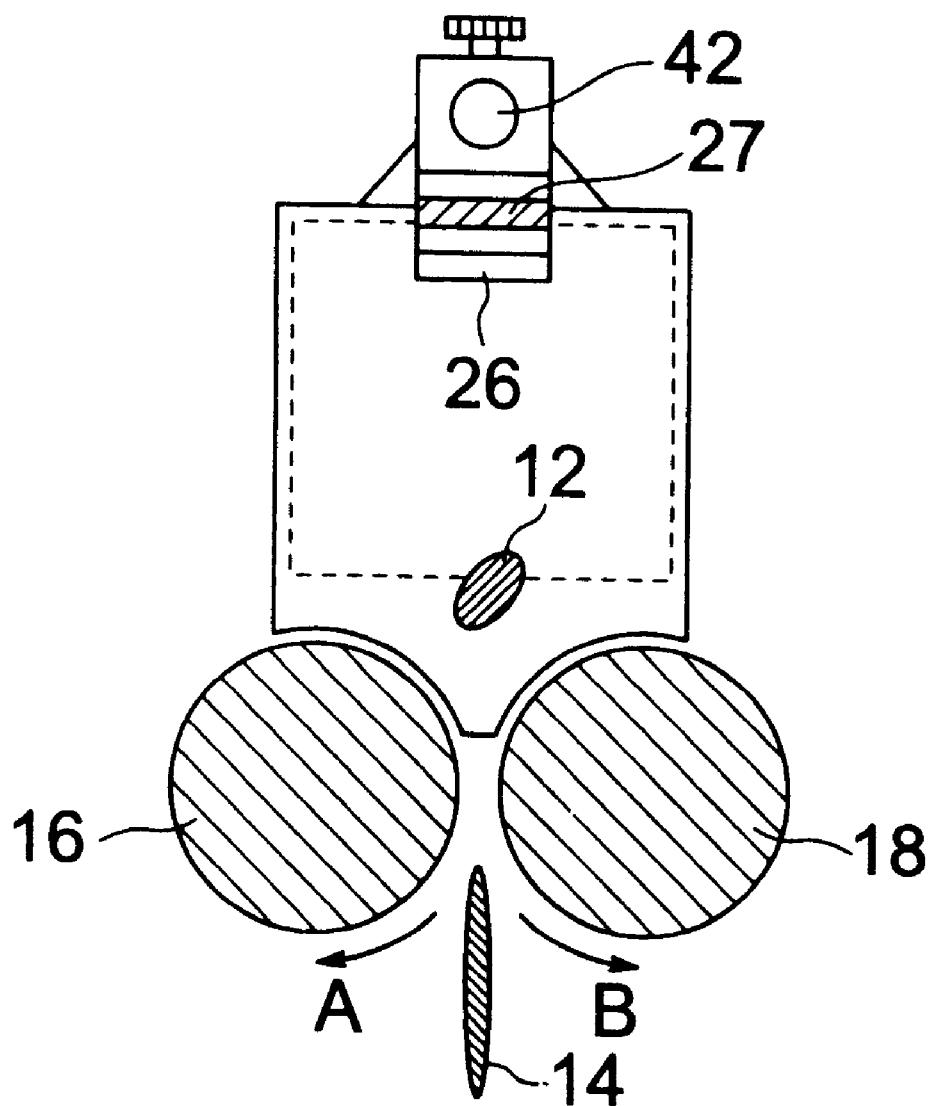
FIG. 2 is a sectional view of the same taken substantially along a line II—II shown in FIG. 1.

At first, description will be directed to the sensor apparatus of the ground-electrode capacitance type by reference to FIGS. 1 and 2 which show schematically a structure of a rolling mill or machine 10 to which the present invention can be applied. The rolling machine 10 is designed for manufacturing a specimen 14 for inspection by rolling a chip 12 of a plastic material such as synthetic rubber or the like. To this end, the rolling machine 10 includes a pair of reduction rolls 16 and 18.

The reduction rolls 16 and 18 are rotatively driven by means of a driving system 20 in mutually opposite directions as indicated by arrows A and B in FIG. 2. Thus, by inserting the chip 12 between the reduction rolls 16 and 18, the chip 12 is squeezed through cooperation of the reduction rolls 16 and 18 to be transformed into the specimen 14 which is then discharged downwardly.

As can be seen in FIG. 2, the chip 12 is charged into the rolling machine manually by an attendant worker or operator. In this conjunction, it will readily be understood that approach of a hand or hands of the operator excessively close to the reduction rolls 16; 18 is dangerous and thus should be avoided. For this reason, the rolling mill or machine 10 is equipped with a safety apparatus denoted generally by reference numeral 24 and incorporating a sensor apparatus denoted generally by 22 to which the present invention can be applied.

As is shown in FIG. 1, the sensor apparatus 22 includes a sheet of electrode plate 26 which is disposed in parallel with the reduction rolls 16 and 18 with a predetermined distance therefrom. More specifically, the electrode plate 26 is disposed at a position above the reduction rolls 16 and 18. A space defined between the electrode plate 26 and the reduction rolls 16; 18 serves as a detecting area for detecting presence or absence of a part of a human body such as the hand of the operator. In the case of the rolling machine illustrated in FIGS. 1 and 2, substantially a whole area existing immediately above the reduction rolls 16; 18 serves as the detecting area.

Disposed at a rear side of the electrode plate 26, i.e., at the side opposite to the detecting area, are a guard plate 27 and a shielding plate 28 both of which are mounted in parallel with the electrode plate 26 with relatively short distances to the latter, respectively. The guard plate 27 as well as the shielding plate 28 is formed of an electrically conductive material having a high conductivity such as stainless steel, copper, aluminum or the like in such size and shape as being capable of covering completely the whole surface of the electrode plate 26.

The electrode plate 26, the guard plate 27 and the shielding plate 28 are supported by a supporting structure 42 which is mounted on a frame 34 of the rolling machine 10. More specifically, the shielding plate 28 is fixedly secured directly to the supporting structure 42 while the guard plate 27 is secured fixedly to the shielding plate 28 by means of bolts or the like made of an insulating material with a spacer 31 also made of an insulating material being interposed between the guard plate 27 and the shielding plate 28. Similarly, the electrode plate 26 is secured fixedly to the guard plate 27 by means of bolts of an insulating material with a spacer 33 also made of an insulating material being interposed between the electrode plate 26 and the guard plate 27. Needless to say, the reduction rolls 16 and 18 are grounded, i.e., electrically connected to the ground potential.

With the structure described above, the electrode plate 26 and the reduction rolls 16; 18 are capacitively coupled to each other. In other words, an electrostatic capacitance exists effectively between the electrode plate 26 and the reduction rolls 16; 18 of the rolling machine 10. Thus, placement or entrance of a part of the human body such as a hand of the operator in the space defined between the electrode plate 26 and the reduction rolls 16; 18 will bring about a corresponding change of the capacitance mentioned above.

With a view to detecting entrance or thrusting of a part (e.g. hand of the operator) of the human body into the space defined between the electrode plate 26 and the reduction rolls 16; 18 in terms of a corresponding change in the capacitance by means of the sensor apparatus 22 implemented in the structure described above, there is provided in association with the sensor apparatus 22 capacitance change detecting circuit 44 to which a signal indicative of the capacitance change mentioned above is inputted as a detection signal.

More specifically, the electrode plate 26 is electrically connected to an input terminal 50 of the capacitance change detecting circuit 44 through the medium of a core or center conductor 48 of a double-layer coaxial cable 46. Additionally, the guard plate 27 is electrically connected to another input terminal 51 of the capacitance change detecting circuit 44 by means of an inner shield conductor 49 of the double-layer coaxial cable 46. Similarly, the shielding plate 28 is electrically connected to the other input terminal 52 of the capacitance change detecting circuit 44 by an outer shield conductor 66 of the double-layer coaxial cable 46.

The capacitance change detecting circuit 44 is implemented in the form of a so-called impedance bridge circuit having four branches or arms, wherein measurement-dedicated power sources 54 and 56 are electrically inserted in two arms, respectively. Further, a capacitor formed by the electrode plate 26 and the reduction rolls 16; 18 constitutes one of the bridge arms. A balancing capacitor 58 is inserted in the remaining arm.

Inserted between a junction terminal 60 of the measurement-dedicated power sources 54 and 56 and grounded terminal 62 to which one end of the balancing capacitor 58 is connected is an output power amplifier 64. Further, the shielding plate 28 is electrically grounded through the medium of the outer shield conductor 66 of the double-layer coaxial cable 46.

Figure 3:
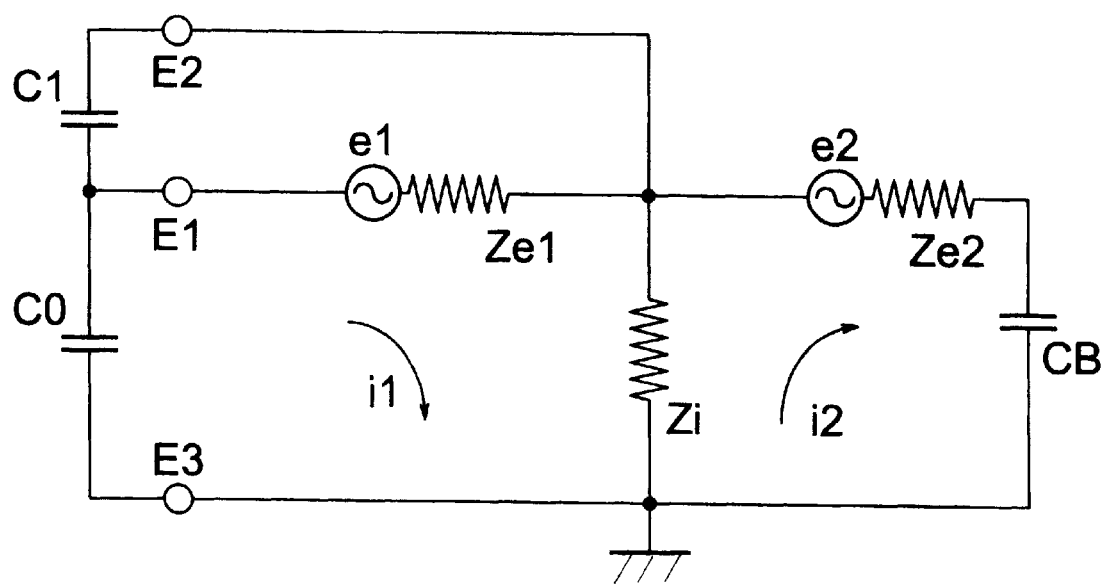
FIG. 3 is a circuit diagram showing an equivalent circuit of the sensor apparatus and a capacitance change detecting circuit shown in FIG. 1 in the state in which the auxiliary electrode is not installed.

FIG. 3 is a circuit diagram showing an equivalent circuit of the capacitance change detecting circuit 44 together with a capacitor representing the capacitance formed between the electrode plate 26 and the reduction rolls 16; 18 and other capacitors effective in the structure shown in FIG. 1.

In FIG. 3, reference symbol $C_0$ designates the capacitance formed between the electrode plate 26 and the reduction rolls 16; 18, symbol $C_1$ designates capacitance formed between the guard plate 27 and the inner shield conductor 49 on one hand and the shielding plate 28 and the outer shield conductor 66. Further, $C_B$ represents electrostatic capacitance of the balancing capacitor 58. Furthermore, $Ze_1$ and $Ze_2$ represent internal impedances of the measurement-dedicated power sources 54 and 56, respectively. Additionally, $Z_i$ represents an internal impedance of the output power amplifier 64. Further, $E_1$ and $E_2$ represents the power sources 54 and 56, respectively.

Description will now be directed to the operation of the circuit shown in FIG. 3. When the measurement-dedicated power sources 54 and 56 are put into operation in the state where only the air exits in the space defined between the electrode plate 26 and the reduction rolls 16; 18, the current flowing through the capacitance $C_1$ from the measurement-dedicated power source 54 can flow to the impedance $Z_i$ when the voltage $e_1$ of the measurement-dedicated power source 54 is sufficiently higher than the voltage given by $Ze_1 \times i_1$.

In that case, when $1/(\omega C_0)$ is sufficiently greater than the internal impedance $Z_i$ of the amplifier 64, substantially all the current $i_1$ flows to the internal impedance $Z_i$. On the other hand, when the current $i_2$ flowing from the measurement-dedicated power source 56 through the capacitance $C_B$ at a same voltage $e_2$ as the voltage $e_1$ is equal to the current $i_1$ with phase difference relative to the current $i_1$ being 180°, the current flowing through the impedance $Z_i$ will be zero.

Now assuming that a dielectric member grounded (e.g. a hand of operator) enters the space defined between the electrode plate 26 and the reduction rolls 16; 18, the capacitance $C_0$ will increase correspondingly in dependence on the relative dielectric constant or permittivity of the dielectric member (the hand of the operator). When this increase or increment is represented by an amount given by $\Delta C$, the current $i_1$ will then increase by $e_1 \omega \Delta C$ to flow through the impedance $Z_i$. Thus, an output signal is generated by the output power amplifier 64. Even when the dielectric member, e.g. the human body, is in a so-called floating state, not being grounded, the capacitance $C_0$ will nevertheless increase, to allow a current to flow through the impedance $Z_i$ to be outputted as a signal. In this way, detection of a part of the human body existing in the space defined between the electrode 26 and the reduction rolls 16; 18 can be realized.

As is apparent from the above, with the circuit configuration shown in FIG. 3, it is possible to detect with high reliability and accuracy the change of capacitance effective between the electrode plate 26 and the reduction rolls 16; 18 without undergoing disturbances exerted by the capacitance formed between the electrode plate 26 and the guard plate 27, the capacitance between the electrode plate 26 and the shielding plate 28, the capacitances of the double-layer coaxial cable 46 and others.

The signal outputted from the output power amplifier 64 of the capacitance change detecting circuit 44 is inputted to a control unit 68 which is designed to generate a control signal in response to the input signal, the outputted signal being then supplied to the driving system 20 for bringing about emergency shutdown of the rolling machine 10 in good timing.

As is shown in FIG. 1, the control unit 68 is comprised of an input interface circuit 70, an output interface circuit 72, a central arithmetic/processing unit 74 which may be constituted by a central processing unit (CPU) and a storage 76 including a RAM (Random Access Memory) and a ROM (Read-Only Memory). The signal applied to the input interface circuit 70 from the capacitance change detecting circuit 44 undergoes analogue-to-digital conversion to be supplied to the central arithmetic/processing unit (CPU) 74 as a digital signal.

The central arithmetic/processing unit 74 serves for arithmetically determining the magnitude $\Delta C$ of change of the capacitance effective between the electrode plate 26 and the reduction rolls 16; 18 on the basis of the digital signal mentioned above. In this conjunction, a minimum value $C_{min}$ of change of the capacitance which takes place when a part of the human body typifying the dielectric enters the space defined between the electrode plate 26 and the reduction rolls 16; 18 may be stored previously in the storage 76. In that case, the central arithmetic/processing unit 74 can be so designed as to compare the magnitude $\Delta C$ of the change of capacitance with the stored value $C_{min}$. When it is decided that the magnitude $\Delta C$ of the change of capacitance exceeds the minimum value $C_{min}$, then the presence of a part of the human body in the space between the electrode plate 26 and the reduction rolls 16; 18 is determined. Thus, the control signal for emergency shutdown can be outputted from the output power amplifier 64 through the output interface circuit 72 to be supplied to the driving system 20 for the rolling machine 10.

In this manner, so long as the hand of operator is positioned outside of the space defined between the electrode plate 26 and the reduction rolls 16; 18 when the chip 12 is thrown into the space, the capacitance effective between the electrode plate 26 and the reduction rolls 16; 18 does not undergo any appreciable change. Thus, the rolling machine 10 can be operated continuously. Of course, the capacitance between the electrode plate 26 and the reduction rolls 16; 18 will also change when the chip 12 moves across the space defined therebetween, the magnitude of which is, however, too small to exceed the minimum value $C_{min}$ stored in the storage 76 of the control unit 68.

On the other hand, when the hand of operator (i.e., a part of the human body) is inserted between the electrode plate 26 and the reduction rolls 16; 18, the capacitance effective therebetween undergoes change of such a magnitude which the safety apparatus triggers the emergency shutdown of the rolling machine 10. In this conjunction, the minimum value $C_{min}$ stored in the storage 76 may be so set that when operator extends his or her hand only a little into the space between the electrode plate 26 and the reduction rolls 16; 18, decision is made that no dangerous state arises. Furthermore, such arrangement may equally be adopted that in case the operator withdraws his or her hand immediately after placing it between the electrode plate and the reduction rolls, no emergency shutdown signal is issued.

Furthermore, in the ground-electrode capacitance type sensor apparatus 22, the guard plate 27 and the grounded shielding plate 28 are disposed at the rear or back side of the shielding plate 28 with a distance therefrom. Consequently, the electric lines of force which are formed are only those that extend from the electrode plate 26 to the reduction rolls 16; 18. Accordingly, even if the hand or a part of the human body is placed at the back side of the electrode plate 26 which presents no danger, any change can not occur in the capacitance effective between the electrode plate 26 and the reduction rolls 16; 18, which in turn means that unnecessary shutdown of the rolling machine 10 can be avoided.

Figure 4:
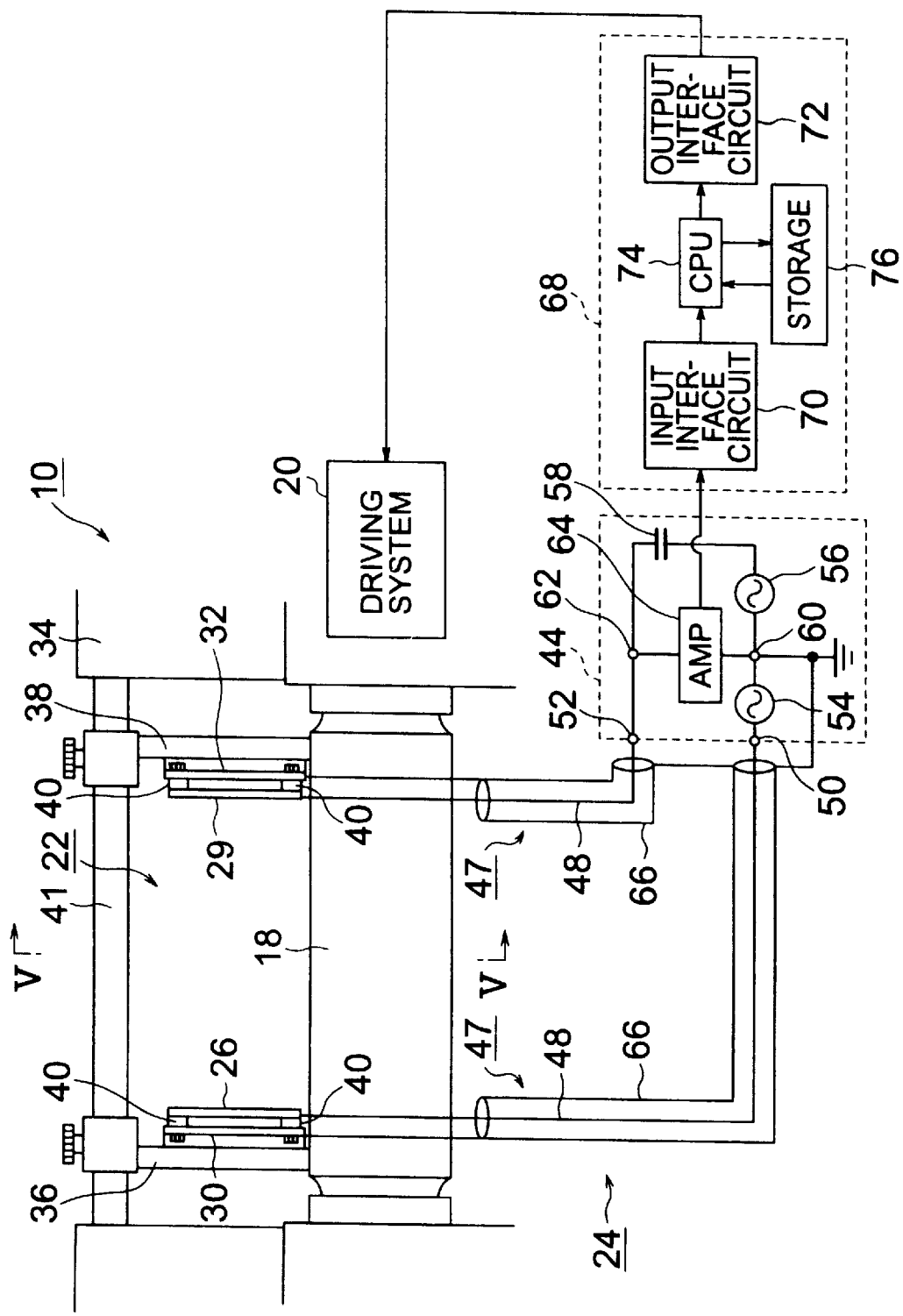
FIG. 4 is a view showing schematically a structure of an inter-electrode capacitance type sensor apparatus and a safety apparatus for a rolling machine in the state in which an auxiliary electrode according to the invention is not installed.
Figure 5:
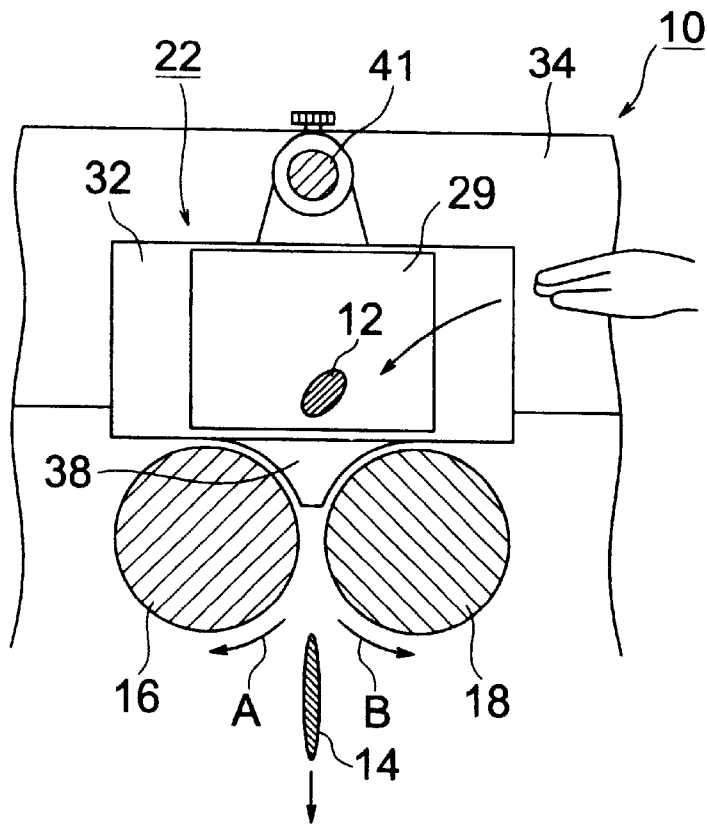
FIG. 5 is a sectional view of the same taken substantially along a line V—V shown in FIG. 4.

Next, referring to FIGS. 4 to 6, description will be made of an inter-electrode capacitance type sensor apparatus 22 to which the present invention can be applied. As is shown in FIGS. 4 and 5, the inter-electrode capacitance type sensor apparatus 22 now under consideration includes a pair of electrode plates 26 and 29 which are disposed in parallel with each other with a predetermined distance therebetween. More specifically, one electrode plate 26 is disposed at one side of the rolling machine 10 above and across the reduction rolls 16 and 18, while the other electrode plate 29 is disposed at the other side of the rolling machine above and across the reduction rolls 16 and 18.

The space defined between the electrode plates 26 and 29 serves as a detecting area for detecting presence or absence of a part of the human body such as a hand of a worker or operator. In the case of the rolling machine now under consideration, substantially a whole space available immediately above the reduction rolls 16; 18 serves as the detecting space or area.

Disposed at the rear sides of the electrode plates 26 and 29, i.e., at the sides opposite to the detecting area, are shielding plates 30 and 32, respectively, both of which are installed in parallel with and in opposition to the electrode plates 26 and 29, respectively, with relatively short distances to the latter, respectively.

The shielding plates 30 and 32 are each made of an electrically conductive material exhibiting a high conductivity such as stainless steel, copper, aluminum or the like in such size and shape as to be capable of covering completely the whole surfaces of the electrode plates 26 and 29, respectively.

The pair of the electrode plates 26 and 29 as well as the pair of the shielding plates 30 and 32 are supported by supporting plates 42, respectively, which are mounted on the frame 34 of the rolling machine 10. More specifically, the shielding plates 30 and 32 are fixedly secured directly to the supporting plate 36 and 38, respectively, while the electrode plates 26 and 29 are secured to the shielding plates 30 and 32, respectively, by means of bolts or the like made of an insulating material with spacers 40 also made of an insulating material being interposed between the electrode plate 26 and the shielding plate 30 and between the electrode plate 29 and the shielding plate 32, respectively.

On the other hand, the supporting plates 36 and 38 are mounted slideably on a supporting shaft 41 which is mounted on the frame 34 so that the positions of the supporting plates 36 and 38 can be adjusted as desired.

In order to detect intrusion of a part of the human body (e.g. a hand of an operator) into the space defined between the electrode plates 26 and 29 in terms of a change in the capacitance effective therebetween with the sensor apparatus 22 implemented in the structure described above, there is provided an capacitance change detecting circuit 44, as in the case of the ground-electrode capacitance type sensor apparatus described hereinbefore by reference to FIGS. 1 to 3. Parenthetically, the structures of the capacitance change detecting circuit 44 and the control unit 68 for the inter-electrode capacitance type sensor apparatus are basically similar to those of the ground-electrode capacitance type sensor apparatus. However, in respect to the details, the inter-electrode capacitance type sensor apparatus differs from the ground-electrode capacitance type sensor apparatus. Accordingly, the sensor apparatus 22 of the inter-electrode capacitance type will be described below in detail. Incidentally, those components or elements of the inter-electrode capacitance type sensor apparatus 22 which serve for the functions same as or equivalent to those mentioned previously are denoted by like reference numerals, respectively.

The electrode plates 26 and 29 are electrically connected to input terminals 50 and 52 of the capacitance change detecting circuit 44 by center conductors 48 of coaxial cables 47, respectively. The capacitance change detecting circuit 44 is implemented in the form of an impedance bridge circuit having four arms, wherein measurement-dedicated power sources 54 and 56 are electrically inserted in two arms, respectively. Further, capacitance formed between the electrode plates 26 and 29 constitutes one of the remaining bridge arms while a balancing capacitor 58 is inserted in the remaining arm. An output power amplifier 64 is provided between a grounded terminal 60 forming a junction between the measurement-dedicated power sources 54 and 56 and a terminal 62 connected to the input terminal 52. On the other hand, the shielding plates 30 and 32 are electrically grounded through the outer conductors 66 of the coaxial cables 47, respectively.

Figure 6:
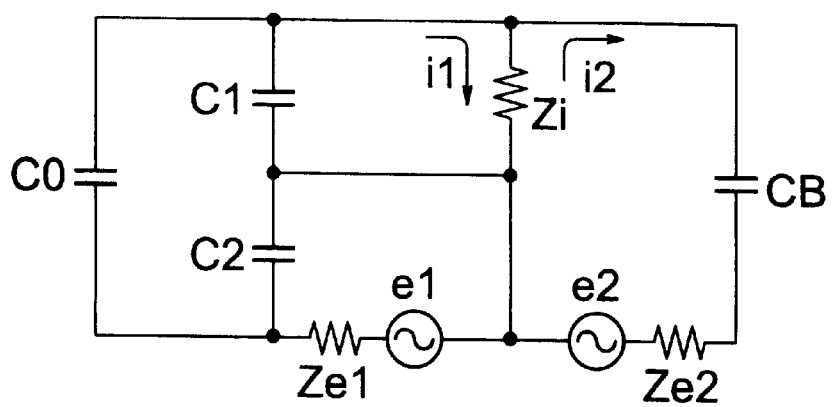
FIG. 6 is a circuit diagram showing an equivalent circuit of the sensor apparatus and a capacitance change detecting circuit shown in FIG. 4 in the state in which the auxiliary electrode is not installed.

FIG. 6 is a circuit diagram showing an equivalent circuit of the capacitance change detecting circuit 44 together with the capacitance formed between the electrode plates 26 and 29 and other capacitors making appearance in other components. In FIG. 6, reference symbol $C_0$ designates capacitance formed between the electrode plates 26 and 29, symbols $C_1$ and $C_2$ designate capacitances formed between the electrode plates 26 and 29 and the shielding plates 30 and 32 and the coaxial cables 47, respectively. Further, $C_B$ designates the capacitance of the balancing capacitor 58. Furthermore, $Ze_1$ and $Ze_2$ represent internal impedances of the measurement-dedicated power sources 54 and 56, respectively. Additionally, $Z_i$ represents an internal impedance of the output power amplifier 64.

Description will now be directed to the operation of the circuit shown in FIG. 6. When the measurement-dedicated power sources 54 and 56 are put into operation in the state in which only the air exits in the space defined between the electrode plates 26 and 29, the current flowing through the capacitance $C_2$ from the measurement-dedicated power source 54 can scarcely flow into the impedance $Z_i$ when the voltage $e_1$ of the measurement-dedicated power source 54 is sufficiently higher than the voltage given by $Ze_1 \times i_1$ In other words, the current flowing through the internal impedance $Z_i$ is negligible.

On the other hand, the current flowing through the capacitor $C_0$ is divided into current components flowing through the capacitor $C_1$ and the impedance $Z_i$, respectively. In that case, when $1/(\omega C_1)$ is sufficiently greater than the impedance value $Z_i$, substantially all the current $i_1$ will flow through the internal impedance $Z_i$. When the current $i_2$ flowing from the measurement-dedicated power source 56 through the capacitor $C_B$ at the same voltage $e_2$ as the voltage $e_1$ is equal to the current $i_1$ with the phase difference relative to the latter being 180°, the current flowing through the impedance $Z_i$ is zero.

Now assuming that a dielectric member grounded, e.g. a part of the human body typified by a hand of the operator, enters or intrudes the space defined between the electrode plates 26 and 29, the dielectric member constitutes an additional part of the capacitances $C_1$ and $C_2$, and thus the capacitance $C_0$ will decrease in dependence on the relative dielectric constant or permittivity of the dielectric member. When this decrement is represented by $\Delta C$, the current $i_1$ will then decrease by an amount given by $e_1 \omega \Delta C$, which allows a current to flow through the impedance $Z_i$ to be thereby outputted as a signal.

Further, when the dielectric member such as the human body is in a so-called floating state, not being grounded, the capacitance $C_0$ increases, to allow a current to flow through the impedance $Z_i$ in the reverse direction.

As is apparent from the above, the circuit configuration shown in FIG. 6 makes it possible to detect with high reliability and accuracy the change of the capacitance effective between the electrode plates 26 and 29 without undergoing disturbances ascribable to the capacitances formed between the electrode plates 26; 29 and the shield plates 30; 32, capacitances of the coaxial cables 47 and others.

The structure of the control unit 68 which issues the emergency shutdown signal in response to the detection signal applied from the capacitance change detecting circuit 44 is essentially same as that of the ground-electrode capacitance type sensor apparatus described hereinbefore by reference to FIGS. 1, 2 and 3.

In operation of the control unit 68, the central arithmetic/processing unit (CPU) 74 arithmetically determines the magnitude $\Delta C$ of the change of capacitance between the electrode plates 26 and 29 on the basis of the input signal supplied from the capacitance change detecting circuit 44. The minimum value $C_{min}$ of the change of capacitance which takes place when a part of the human body which is a typical one of the so-called dielectric intrudes the space defined between the electrode plates 26 and 29 may be stored previously in the storage 76. In that case, the central arithmetic/processing unit 74 compares the magnitude $\Delta C$ of the change of capacitance as determined and the data $C_{min}$ with each other. When it is decided that the magnitude $\Delta C$ of the change of capacitance exceeds the minimum value $C_{min}$ presence of a part of the human body between the electrode plates 26 and 29 is determined, whereby the control signal for emergency shutdown of the roll mill 10 is outputted from the control unit 68 through the output interface circuit 72 to be supplied to the driving system 20 for the rolling machine 10.

In this manner, with the safety apparatus 24 equipped with the inter-electrode capacitance type sensor apparatus 22, the capacitance between the electrode plates 26 and 29 does not change appreciably, allowing the rolling machine 10 to operate continuously, so far as the hand of the operator is positioned outside of the space defined between the electrode plates 26 and 29 when the chip 12 is thrown into the rolling machine.

Of course, the capacitance will change when the chip 12 moves through and across the space defined between the electrode plates 26 and 29. However, the magnitude of the change is too small to exceed the minimum value $C_{min}$ stored in the storage 76 of the control unit 68.

On the other hand, when the hand of operator (i.e., a part of the human body) is inserted between the electrode plates 26 and 29, the capacitance therebetween undergoes change of such magnitude which causes the safety apparatus 24 to trigger the emergency shutdown of the rolling machine 10. In this conjunction, the minimum value $C_{min}$ stored in the storage 76 may be so selectively set that when operator extends his or her hand only a little into the space between the electrode plates 26 and 29, decision is made that no dangerous state arises. Furthermore, such arrangement may equally be adopted that in case the operator withdraws his or her hand immediately after placing it between the electrode plates, no emergency shutdown signal can be generated.

Furthermore, in the sensor apparatus 22 of the inter-electrode capacitance type, the grounded shielding plates 30 and 32 are disposed at the rear or back sides of the electrode plates 26 and 29, respectively, with a distance therefrom. Consequently, no electric lines of force make appearance which extend from the rear surface of one electrode plate 26 to that of the other electrode plate 29. Accordingly, even if the hand or other part of the human body is placed on the rear surface of the electrode plate 26 or 29 which is of no danger, any change does not occur in the capacitance effective between the electrode plates 26 and 29, which means that unnecessary shutdown of the rolling machine 10 can be avoided.

Figure 7:
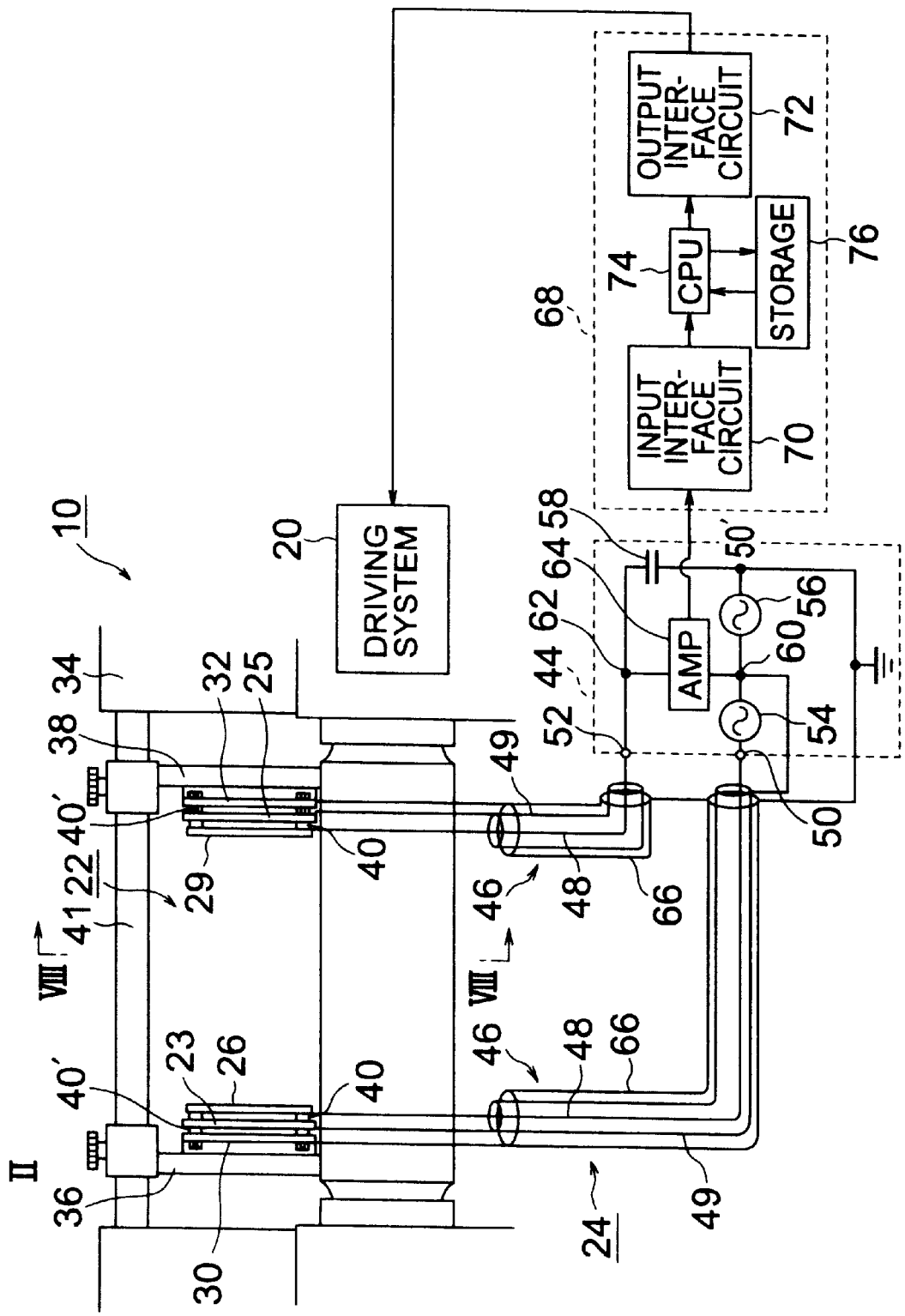
FIG. 7 is a view showing schematically a structure of an inter-electrode/ground-electrode capacitance type sensor apparatus and a safety apparatus for a rolling machine in the state in which an auxiliary electrode according to the invention is not installed.
Figure 8:
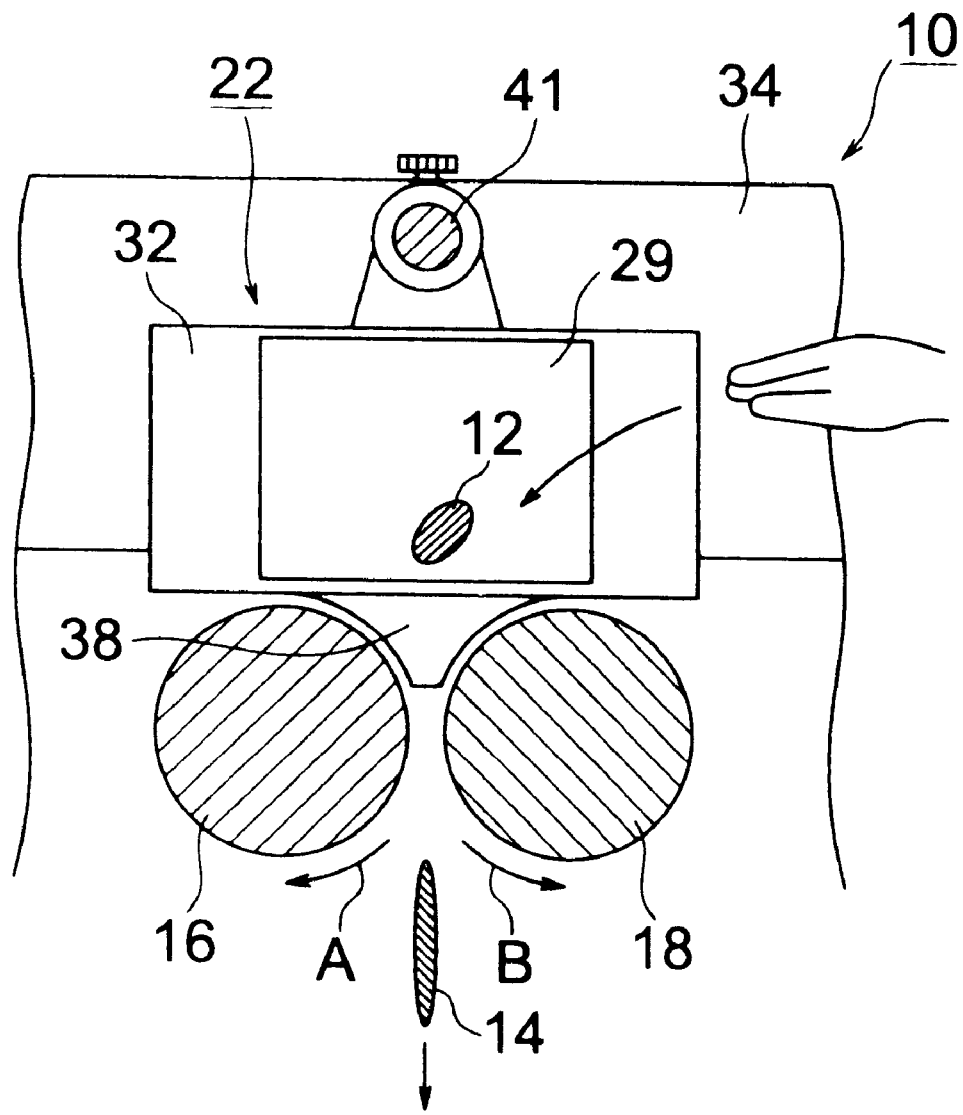
FIG. 8 is a sectional view of the same taken substantially along a line VIII—VIII shown in FIG. 7.
Figure 9:
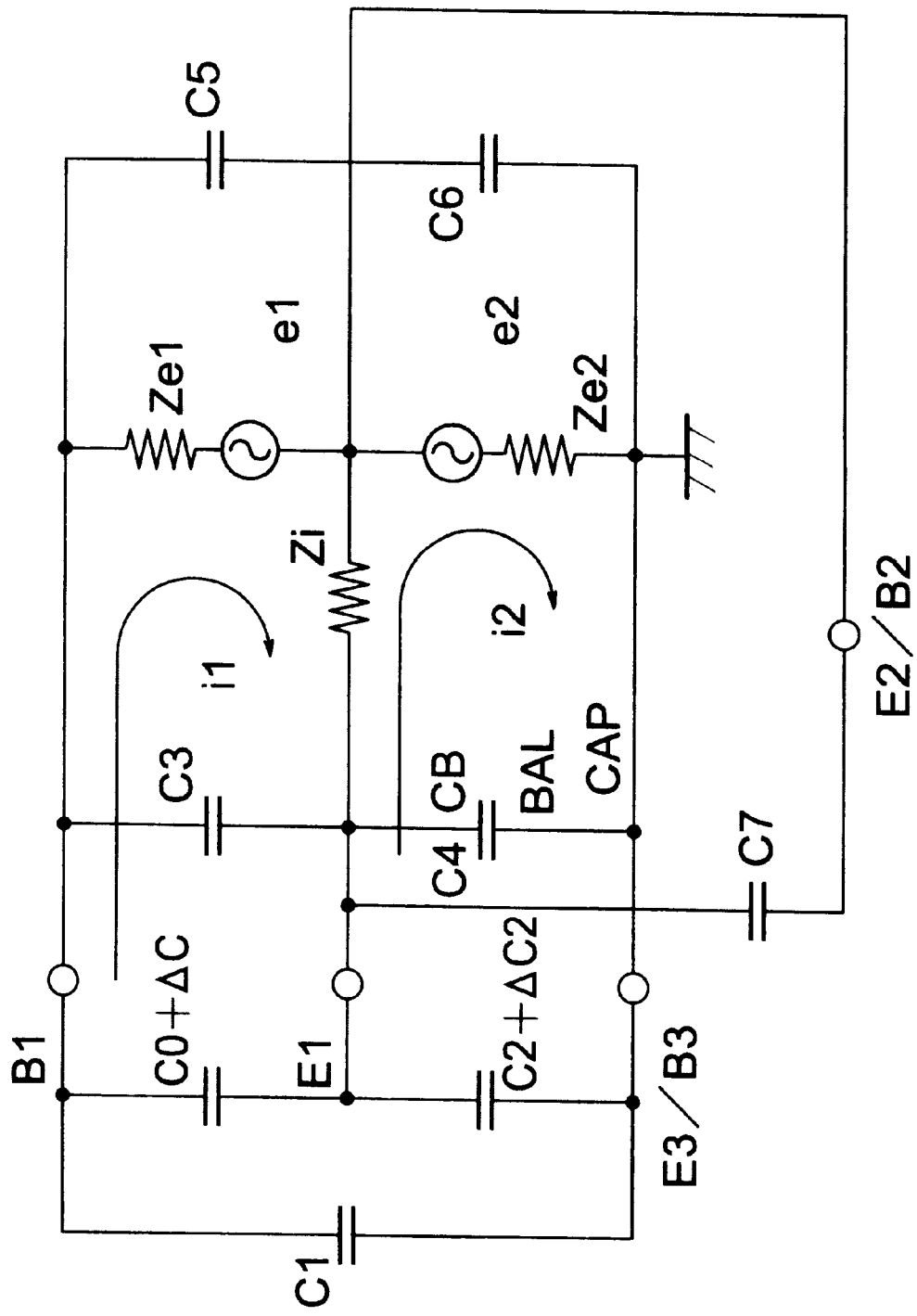
FIG. 9 is a circuit diagram showing an equivalent circuit of the sensor apparatus and a capacitance change detecting circuit shown in FIG. 7 in the state in which the auxiliary electrode is not installed.

Next, referring to FIGS. 7, 8 and 9, description will turn to the sensor apparatus of inter-electrode/ground-electrode capacitance type to which the present invention can be applied. FIGS. 7, 8 and 9 are views showing schematically a structure of a rolling machine 10 equipped with the sensor apparatus of the inter-electrode/ground-electrode capacitance type. The rolling machine 10 is also designed for manufacturing a specimen 14 for inspection by rolling a chip 12 of a plastic material such as synthetic rubber or the like. To this end, the rolling machine 10 includes a pair of reduction rolls 16 and 18. The reduction rolls 16 and 18 are rotatively driven by a driving system 20 in mutually opposite directions as indicated by arrows A and B, respectively, in FIG. 8. Thus, by throwing the chip 12 into the space defined between the reduction rolls 16 and 18, the chip 12 is squeezed through cooperation of the reduction rolls 16 and 18 to be transformed into a specimen 14 which is then discharged downwardly from the machine.

As can be seen in FIG. 8, the chip 12 is thrown by a hand of an operator or a worker. In this conjunction, it will readily be understood that moving of the operator's hand excessively close to the reduction rolls 16; 18 is risky and should be evaded. For this reason, the rolling machine 10 is equipped with a safety apparatus 24 incorporating the sensor apparatus 22 to which the present invention can find application.

As is shown in FIG. 7, the sensor apparatus 22 now under consideration includes a pair of electrode plates 26 and 29 which are disposed in parallel with each other with a predetermined distance therebetween. More specifically, one electrode plate 26 is disposed at one side of the rolling machine 10 just above the reduction rolls 16 and 18. The other electrode plate 29 is also disposed at the other side of the rolling machine 10 above the reduction rolls 16; 18. The space defined between these electrode plates 26 and 29 is destined to serve as a detecting area for detecting presence or absence of a part of the human body such as a hand of the operator or the like. In the case of the rolling machine now under consideration, substantially whole area available immediately above the reduction rolls 16; 18 serves as the detecting area.

Disposed at rear sides of the electrode plates 26 and 29, i.e., at the sides opposite to the detecting area, are guard plates 23 and 25, respectively, and shielding plates 30 and 32 which are grounded, i.e., connected to the ground potential, wherein the guard plates 23 and 25 and the shielding plates 30 and 32 are disposed in parallel and in opposition to the corresponding electrode plates 26 and 29 with relatively short distances from the latter, respectively. The guard plates 23 and 25 and the shielding plates 30 and 32 are each made of an electrically conductive material having a high conductivity such as stainless steel, copper, aluminum or the like and formed in such size and shape as to be capable of covering completely the whole surfaces of the electrode plates 26 and 29, respectively.

The electrode plates 26 and 29 as well as the guard plates 23 and 25 and the shielding plates 30 and 32 are supported by supporting plates 36 and 38, respectively, which are mounted on a frame 34 of the rolling machine 10. More specifically, the shielding plates 30 and 32 are fixedly secured directly to the supporting plates 36 and 38, respectively. The guard plates 23 and 25 are secured fixedly to the shielding plates 30 and 32 by means of bolts or the like made of an insulating material with spacers 40' also made of an insulating material being interposed between the guard plates 30; 32 and the shielding plates 30; 32, respectively. Similarly, the electrode plates 26 and 29 are secured fixedly to the guard plates 23 and 25, respectively, by means of bolts of an insulating material with spacers 40 also made of an insulating material being interposed between the electrode plates 26; 29 and the guard plates 30; 32, respectively. On the other hand, the supporting plates 36 and 38 are mounted slideably on a supporting shaft 41 which is in turn mounted on the frame 34 so that the positions of the supporting plates 36 and 38 can be adjusted, respectively, as desired.

With a view to detecting intrusion of a part of the human body (e.g. hand of the operator) into the space defined between the electrode plates 26 and 29 in terms of a corresponding change in the capacitance with the sensor apparatus 22 implemented in the structure described above, there is provided a capacitance change detecting circuit 44 to which a signal indicative of the change of capacitance mentioned above is inputted as a detection signal. More specifically, the electrode plates 26 and 29 are electrically connected to input terminals 50 and 52, respectively, of the capacitance change detecting circuit 44 through the medium of center conductors 48 of double-layer coaxial cables 46, respectively. The capacitance change detecting circuit 44 is implemented in the form of a so-called impedance bridge having four arms, wherein measurement-dedicated power sources 54 and 56 are electrically inserted in two arms, respectively. Further, a capacitor constituted by the electrode plates 26 and 29 is connected in one of the arms while a balancing capacitor 58 is inserted in the remaining arm. Electrically inserted between a junction terminal 60 formed of the measurement-dedicated power sources 54 and 56 and a junction 62 between the capacitor constituted by the electrode plates 26; 29 and the balancing capacitor 58 is an output power amplifier (AMP) 64. Terminal 50' of the measurement-dedicated power source 56 is grounded, i.e., connected to the ground potential. The guard plates 23 and 25 and the shielding plates 30 and 32 are grounded through the medium of the inner conductors 49 of the double-layer coaxial cables 46 and the outer conductors 66 of the double-layer coaxial cable 46, respectively.

FIG. 9 is a circuit diagram showing an equivalent circuit of the capacitance change detecting circuit 44 together with a capacitor representing the capacitance formed between the electrode plates 26 and 29 and other capacitors representing the capacitances making appearance in the structure shown in FIG. 7. More specifically, in FIG. 9, reference symbol $C_0$ designates a capacitor representing the capacitance formed between the electrode plates 26 and 29. Reference symbols $C_1$ and $C_2$ designate capacitors representing the capacitances formed between the electrode plates 26 and 29 and the reduction rolls 16; 18, respectively. Further, $C_3$ denotes a capacitor representing collectively the capacitances due to the guard plates 23 and 25 and the bilayer coaxial cables 46, and $C_B$ represents capacitance of the balancing capacitor 58. Furthermore, $Ze_1$ and $Ze_2$ represent internal impedances of the measurement-dedicated power sources 54 and 56, respectively. Additionally, $Z_i$ represents an internal impedance of the output power amplifier 64.

Description will now be directed to the operation of the circuit shown in FIG. 9 in which $C_5$ and $C_6$ represent the capacitances making appearance due to the disposition of the guard plate 25 between the electrode plate 29 and the shielding plate 32 and the disposition of the guard plate 23 between the electrode plate 26 and the shielding plate 30, respectively, while $C_3$ and $C_B$ represent capacitors provided additionally between the electrode plates 29 and 26 and between the electrode plate 29 and the shielding plate 30 with a view to facilitating realization of the balanced state of the bridge circuit. When the power sources $e_1$ and $e_2$ are turned on in the state in which only the air exists between the electrode plates 29 and 26, the current $i_1$ flowing from the power source e, through the impedance $Z_1$ and a combined capacitance $C_{O3}$ of the capacitors $C_0$ and $C_3$ is equal to a current $i_2$ which flows from the power source $e_2$ through the impedance $Z_i$ and a combined capacitance $C_{2B}$ of the capacitors $C_2$ and $C_B$. Thus, when phase difference between the currents $i_1$ and $i_2$ is 180°, the current flowing through the impedance $Z_i$ is zero. Now it is assumed that a dielectric member (a part of the human body) enters the space defined between the electrode plates 29 and 26. Then, the capacitance $C_0$ will decrease by an amount corresponding to the relative dielectric constant or permittivity of the dielectric member. By representing this decrement by $\Delta C$, the current $i_1$ will then decrease by an amount of $e_1 \omega \Delta C$, as a result of which a current flows through the impedance $Z_i$ to be thereby detected as a signal.

As is apparent from the above, with the circuit configuration shown in FIGS. 7 and 9, it is possible to detect with high accuracy and reliability the capacitance effective between the electrode plates 26 and 29 without undergoing disturbances ascribable to the capacitances formed between the electrode plates 26; 29 on one hand and the guard plates 23; 25 and the shielding plates 30; 32 on the other hand, the capacitances of the bilayer coaxial cables 46 and others.

The signal outputted from the output power amplifier 64 of the capacitance change detecting circuit 44 is inputted to the control unit 68 which is designed to generate a control signal in response to the input signal. The control signal is then supplied to the driving system 20 for triggering the emergency shutdown of the rolling machine 10.

In more concrete, the control unit 68 is comprised of an input interface circuit 70, an output interface circuit 72, a central arithmetic/processing unit (CPU) 74 and a storage 76, as can be seen in FIG. 7. The signal outputted from the capacitance change detecting circuit 44 and inputted through the input interface circuit 70 undergoes analogue-to-digital conversion to be supplied to the central arithmetic/processing unit 74 as a digital signal. The central arithmetic/processing unit 74 serves for arithmetically determining the magnitude $\Delta C$ of the change of capacitance which makes appearance between the electrode plates 26 and 29 on the basis of the input signal. In this conjunction, a minimum value $C_{min}$ of the change of capacitance which takes place when a part of human body, a typical one of the dielectrics, enters the space defined between the electrode plates 26 and 29 may be stored previously in the storage 76. In that case, the central arithmetic/processing (CPU) unit 74 may be so designed as to compare the magnitude $\Delta C$ of the change of capacitance as determined with the stored data $C_{min}$. When it is decided that the magnitude $\Delta C$ of the change of capacitance exceeds the minimum value $C_{min}$ then the presence of the dielectric, e.g. a part of human body in the space between the electrode plates 26 and 29 is determined, whereby the control signal for emergency shutdown of the rolling machine 10 is outputted from the control unit 68 through the output interface circuit 72 to be supplied to the driving system 20 of the rolling machine 10 for validating the emergency shutdown thereof.

Next, operation of the safety apparatus 24 will be described briefly. So far as the hand of the operator is positioned outside of the space defined between the electrode plates 26 and 29 when the chip 12 of plastic material or the like is thrown into the space, the capacitance between the electrode plates 26 and 29 does not undergo any appreciable change, allowing thus the rolling machine 10 to operate continuously. Of course, the capacitance will change when the chip 12 moves through and across the space defined between the electrode plates 26 and 29, the magnitude of which is, however, too small to exceed the minimum value $C_{min}$ stored in the storage 76 of the control unit 68. On the other hand, when the hand of an operator (i.e., a part of the human body) is inserted between the electrode plates 26 and 29, the capacitance therebetween undergoes change of such magnitude which causes the safety apparatus to trigger the emergency shutdown of the rolling machine 10. In this conjunction, the minimum value $C_{min}$ stored in the storage 76 may be so set that when the operator extends his or her hand only a little into the space between the electrode plates 26 and 29, decision made by the central arithmetic/processing unit 74 is to such effect that no dangerous or risky state arises. Furthermore, such arrangement may equally be S adopted that in case the operator withdraws his or her hand immediately after placing it between the electrode plates, generation of the emergency shutdown signal is prevented. This feature can be realized by implementing the control unit 68 such that decision as to occurrence of the risky state is made by taking into consideration the rate of change of the capacitance as a function of time.

Furthermore, in the sensor apparatus 22 according to the instant embodiment of the invention, the guard plates 23; 25 and the shielding plates 30; 32 grounded are disposed at the rear sides of the electrode plates 26; 29 with distances therefrom, respectively. Consequently, no electric lines of force are formed which extend from the rear surface of one electrode plate, e.g. 26 to that of the other electrode plate 29. Accordingly, even if a hand or a part of the human body is placed on the rear surfaces of the electrode plates 26; 29 which are of no danger, any change can not occur in the capacitance making appearance between the electrode plates 26 and 29, which means that shutdown of the rolling machine 10 in vain can be avoided.

In the sensor apparatuses of the ground-electrode capacitance type, the inter-electrode capacitance type and the ground-electrode/inter-electrode capacitance type described above, such arrangement is adopted that operation of the rolling machine 10 is shut down in response to the signal outputted from the control unit 68 of the safety apparatus 24. However, the invention is never restrict to such arrangement. Instead of stopping the operation of the rolling machine, only an alarm may be generated for messaging occurrence of insecure or risky state to the operator, calling his or her attention. Alternatively, generation of the alarm and the shutdown of operation of the rolling machine may simultaneously be validated. In any case, safety can be ensured. Of course, any other appropriate safety securing means can be resorted to.

In the foregoing, description has been directed to the structures and operations of the sensor apparatus 22 of the ground-electrode capacitance type, inter-electrode capacitance type and the inter-electrode/ground-electrode capacitance type on the presumption that detection of operator's hand accessing to the risky space above the mill rollers is of concern. In conjunction with such sensor apparatuses, the present invention is concerned with a means for monitoring whether the sensor apparatus 22 is steadily operating normally, which will now be described below.

Figure 10:
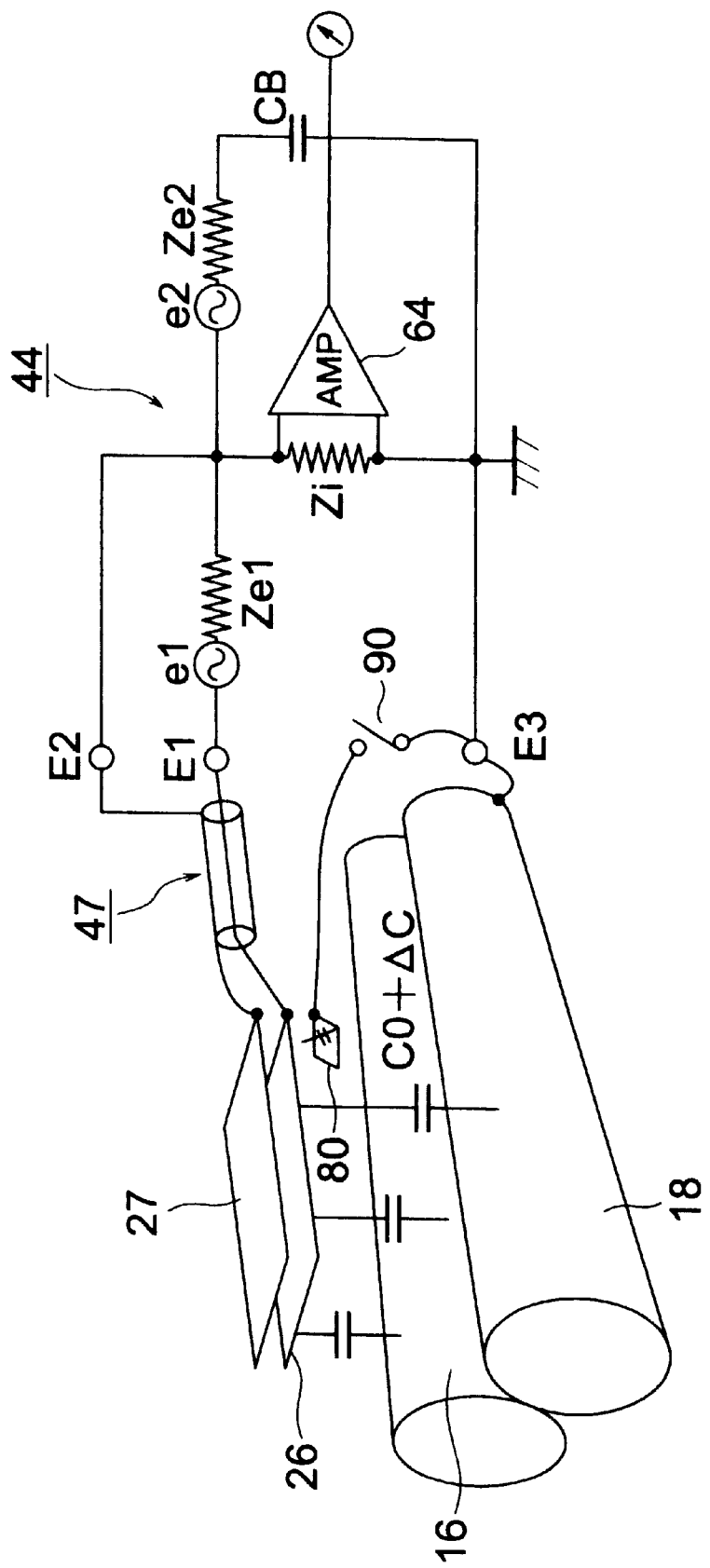
FIG. 10 is a view showing only schematically structures of a ground-electrode capacitance type sensor apparatus, a capacitance change detecting circuit and a monitoring circuit including an auxiliary electrode plate according to a first embodiment of the present invention.
Figure 11:
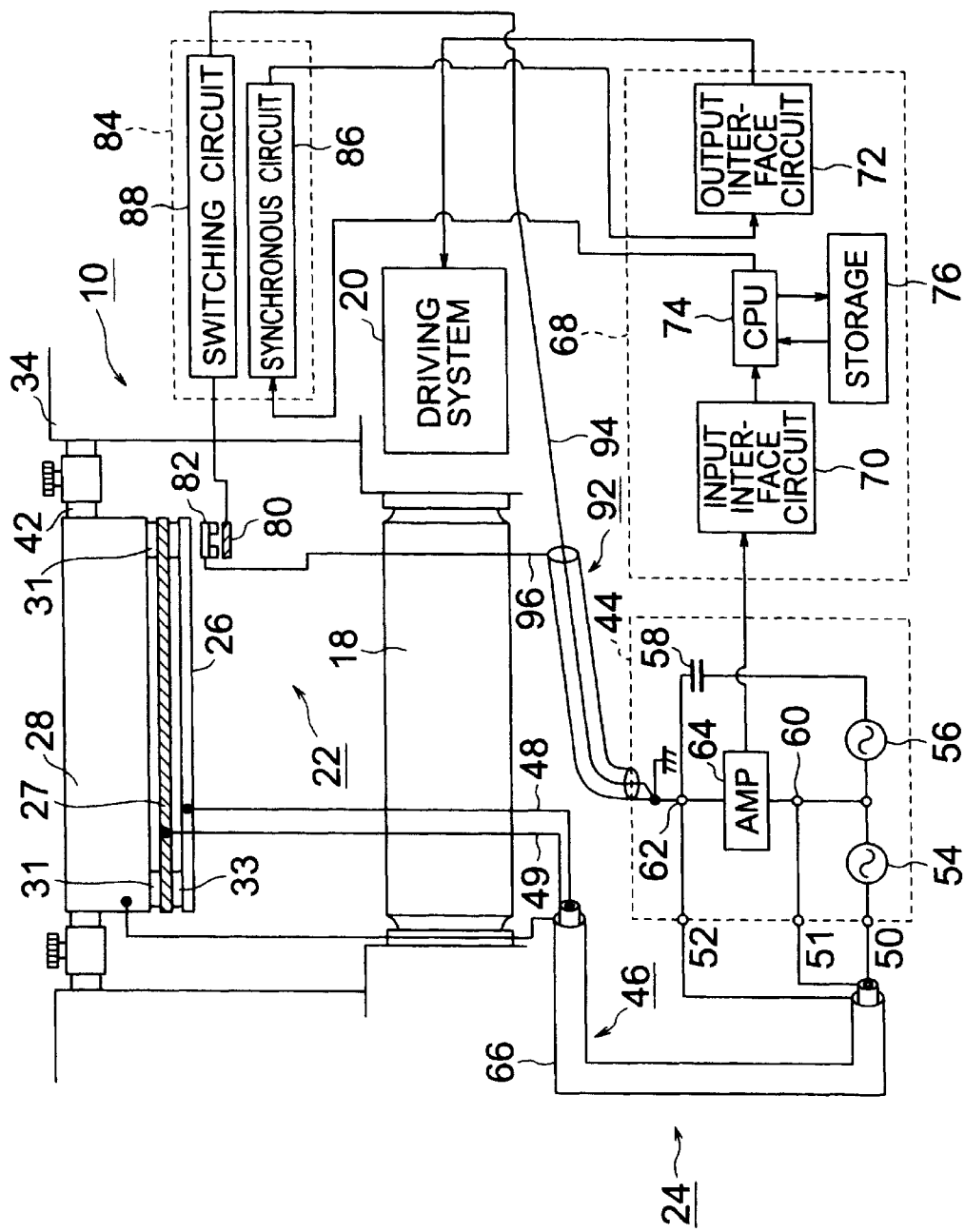
FIG. 11 is a view showing schematically a structure of a rolling machine together with a circuit configuration of the ground-electrode capacitance type sensor apparatus, the capacitance change detecting circuit and the monitoring apparatus including the auxiliary electrode plate according to the first embodiment of the invention.

According to a first embodiment of the present invention, there is provided a ground-electrode capacitance type sensor apparatus 22 which is imparted with the monitoring function mentioned above. FIGS. 10 and 11 are views showing schematically a structure of the sensor apparatus equipped with the monitoring device according to the instant embodiment of the invention. Referring to FIGS. 10 and 11, an auxiliary electrode plate 80 of a small area is disposed in parallel and in opposition to the electrode plate 26 with a short distance therefrom, wherein the auxiliary electrode plate 80 is adapted to be controllably grounded, i.e., electrically connected to the ground potential so that the capacitance change detecting circuit 44 can generate an output signal similar to that generated upon detection of the access of a part of the human body, when the auxiliary electrode plate 80 is connected to the ground potential. As can be seen in FIG. 11, an insulating material 82 is disposed on one surface of the auxiliary electrode plate 80 which faces toward the electrode plate 26. The insulating material 82 serves for preventing occurrence of a short-circuit event between the auxiliary electrode plate 80 and the electrode plate 26.

Disposed between the central arithmetic/processing unit (CPU) 74 of the control unit 68 and the output interface circuit 72 is a control circuit 84 which is comprised of a synchronous circuit 86 and a switching circuit 88. By turning on or off a switching element 90 (see FIG. 10) incorporated in the switching circuit 88, the auxiliary electrode plate 80 is grounded or set to the floating state.

The switching element 90 may be so designed as to be turned on or closed during a period, for example, on the order of milliseconds per second in a repetitive manner so that the auxiliary electrode plate 80 is forced to be periodically grounded every second for the purpose of monitoring whether the sensor apparatus 22 is operating in a normal state.

In more concrete, one terminal of the switching element 90 of the switching circuit 88 is electrically connected to one end of the auxiliary electrode plate 80 while the other terminal of the switching element 90 is electrically connected to one end of a center conductor 94 of a coaxial cable 92, the other end of the center conductor 94 being grounded internally of the capacitance change detecting circuit 44, as can be seen in FIG. 11.

Further, the insulating material 82 is connected to the shielding conductor for serving as the external conductor of the coaxial cable 92, which conductor is also grounded internally of the capacitance change detecting circuit 44.

Further, the synchronous circuit 86 incorporated in the control circuit 84 is connected between the central arithmetic/processing unit 74 and the output interface circuit 72. Every time the switching element 90 is turned on or closed, the outer conductor 66 suppresses the detection signal from being outputted from the central arithmetic/processing unit 74 to be supplied to the output interface circuit 72 to thereby prevent the emergency shutdown of the driving system 20 for the rolling machine from being validated in the monitoring operation phase.

Figure 12:
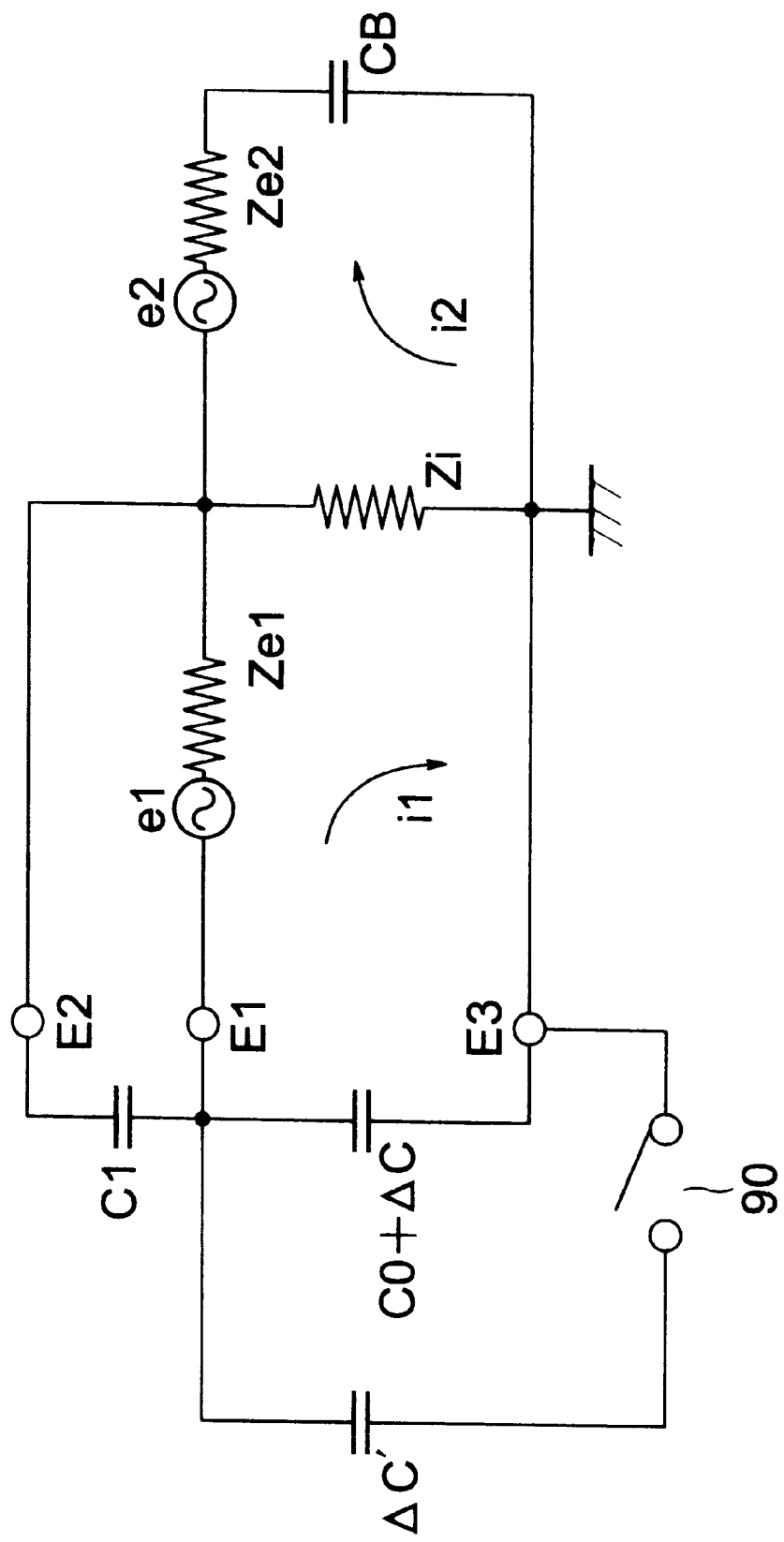
FIG. 12 is an equivalent circuit of the capacitance change detecting circuit and the monitoring apparatus including the auxiliary electrode plate according to the first embodiment of the invention.

FIG. 12 is an equivalent circuit diagram of the capacitance change detecting circuit which is equipped with the monitoring circuit according to the instant embodiment of the present invention. As can be seen from comparison of FIG. 12 with FIG. 3, the circuit configuration shown in FIG. 12 differs from that shown in FIG. 3 in the respect that a series circuit of the switching element 90 and a capacitor $\Delta C'$ representing a capacitance due to the auxiliary electrode plate 80 in the floating state thereof is connected in parallel with the capacitor $C_0$.

When the switching element 90 is turned on or closed under the control of the central arithmetic/processing unit (CPU) 74, the auxiliary electrode plate 80 is electrically connected to the ground potential, as a result of which the capacitance $\Delta C'$ becomes effective between the auxiliary electrode plate 80 and the electrode plate 26 to be electrically connected in parallel with the capacitance $C_0$, resulting in that the capacitance $C_0$ is increased by a proportion $\Delta C$ corresponding to the capacitance $\Delta C'$, which means that the change of capacitance $C_0$ comparable to that brought about upon detection of a part of the human body, e.g. a hand of operator, does occur, whereby an essentially same detection signal as the human body detection signal is outputted from the capacitance change detecting circuit.

At this juncture, it should be mentioned in conjunction with the circuit shown in FIG. 12 that the capacitance $\Delta C'$ making appearance between the auxiliary electrode plate 80 and the electrode plate 26 when the switching element 90 is in the off-state is smaller than the minimum value $C_{min}$ of the change of capacitance mentioned hereinbefore. Accordingly, in the open or off state of the switching element 90, the signal comparable to that indicating the absence of the human body is generated. On the other hand, when the switching element 90 is closed, the capacitance $C_0$ increases by a proportion $\Delta C$ corresponding to the capacitance $\Delta C'$, which results in generation of the detection signal comparable to the human body detection signal.

When the detection signal is generated upon closing of the switching element 90, this signal indicates that the sensor apparatus 22 is operating normally. Accordingly, a corresponding message may visibly be displayed to be readily recognized by the operator. Similarly, unless the sensor apparatus 22 is normal, a message to such effect may be generated for calling attention of the operator working in the neighborhood. In this way, the normality of the sensor apparatus 22 can constantly be monitored for making sure that the sensor apparatus 22 is operating normally.

Figure 19:
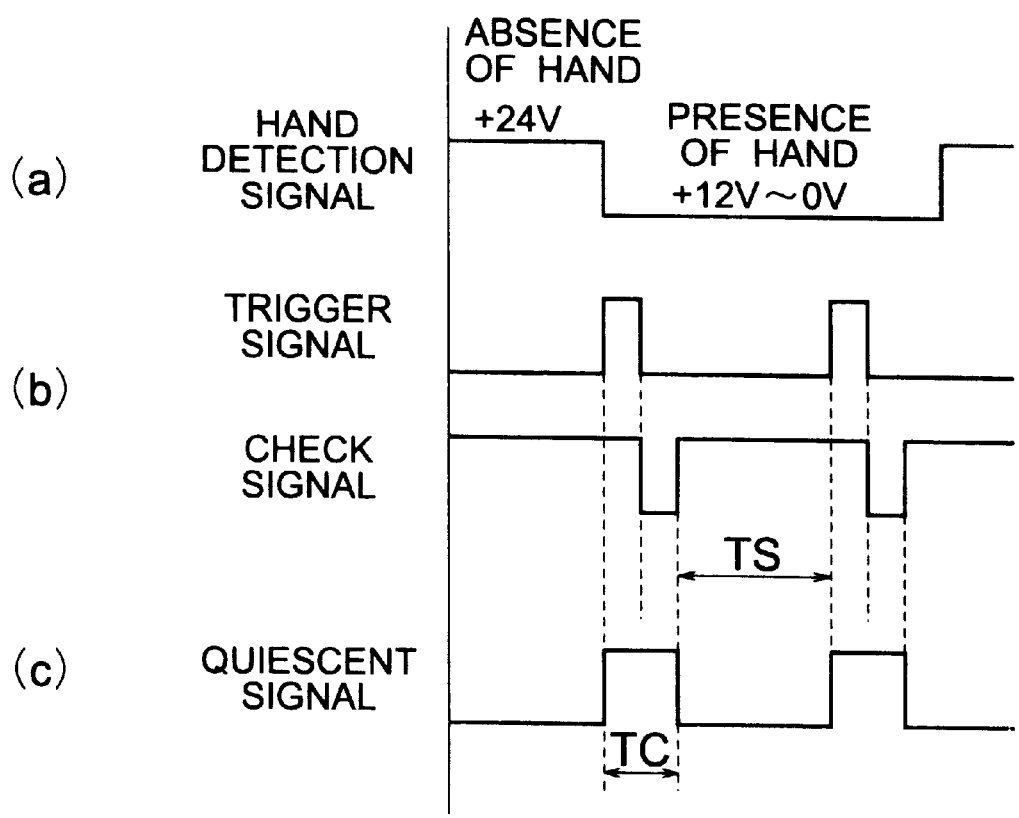
FIG. 19 is a timing chart for illustrating operations of the apparatuses according to the first, second and third embodiments of the present invention, respectively.

FIG. 19 is a timing chart for illustrating the operations described above. In this figure, an output voltage of the output power amplifier 64 shown in FIG. 10 is illustrated at (a). Unless a part of human body such as operator's hand is detected, the output voltage of the output power amplifier 64 assumes a voltage level of e.g. +24 V. On the other hand, when the hand is detected, the output voltage assumes a voltage level of e.g. 0 to +12 V to serve, as the safety securing information signal.

Shown at (b) in FIG. 19 is a trigger signal issued from the central arithmetic/processing unit 74, which is then followed by a check signal for closing or turning on the switching element 90 incorporated in the switching circuit 88, which involves connection of the auxiliary electrode plate 80 to the ground potential. Subsequently, the switching element 90 is turned off, whereon transition is made to the ordinary capacitance change sensing or detecting operation phase.

During a monitoring period TC extending from the leading edge of the trigger pulse to the trailing edge of the check signal, a quiescent signal is outputted, as shown at (c) in FIG. 19, for the purpose of interrupting the detection signal supplied to the output interface circuit 72 during the monitoring period, to thereby prevent inadvertent shutdown of the rolling machine by the driving system 20.

Incidentally, the monitoring period TC shown in FIG. 19 may be set to be 30 mS, while the ordinary sensing or detecting period TS may be set to be e.g. one second. Of course, this is only by way of example. The time durations of these periods can be set rather arbitrarily and altered appropriately or empirically.

Figure 13:
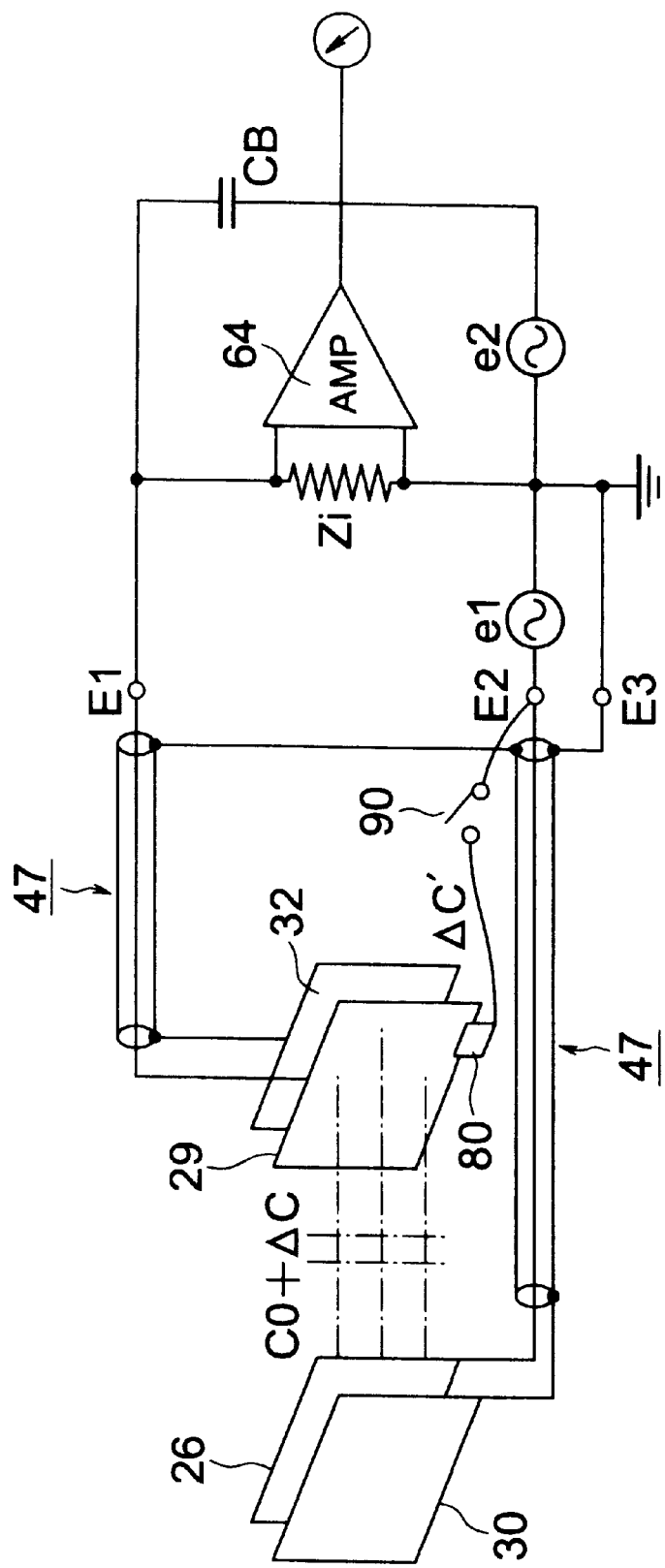
FIG. 13 is a view showing only schematically structures of a inter-electrode capacitance type sensor apparatus, a capacitance change detecting circuit and a monitoring circuit including an auxiliary electrode plate according to a second embodiment of the present invention.
Figure 14:
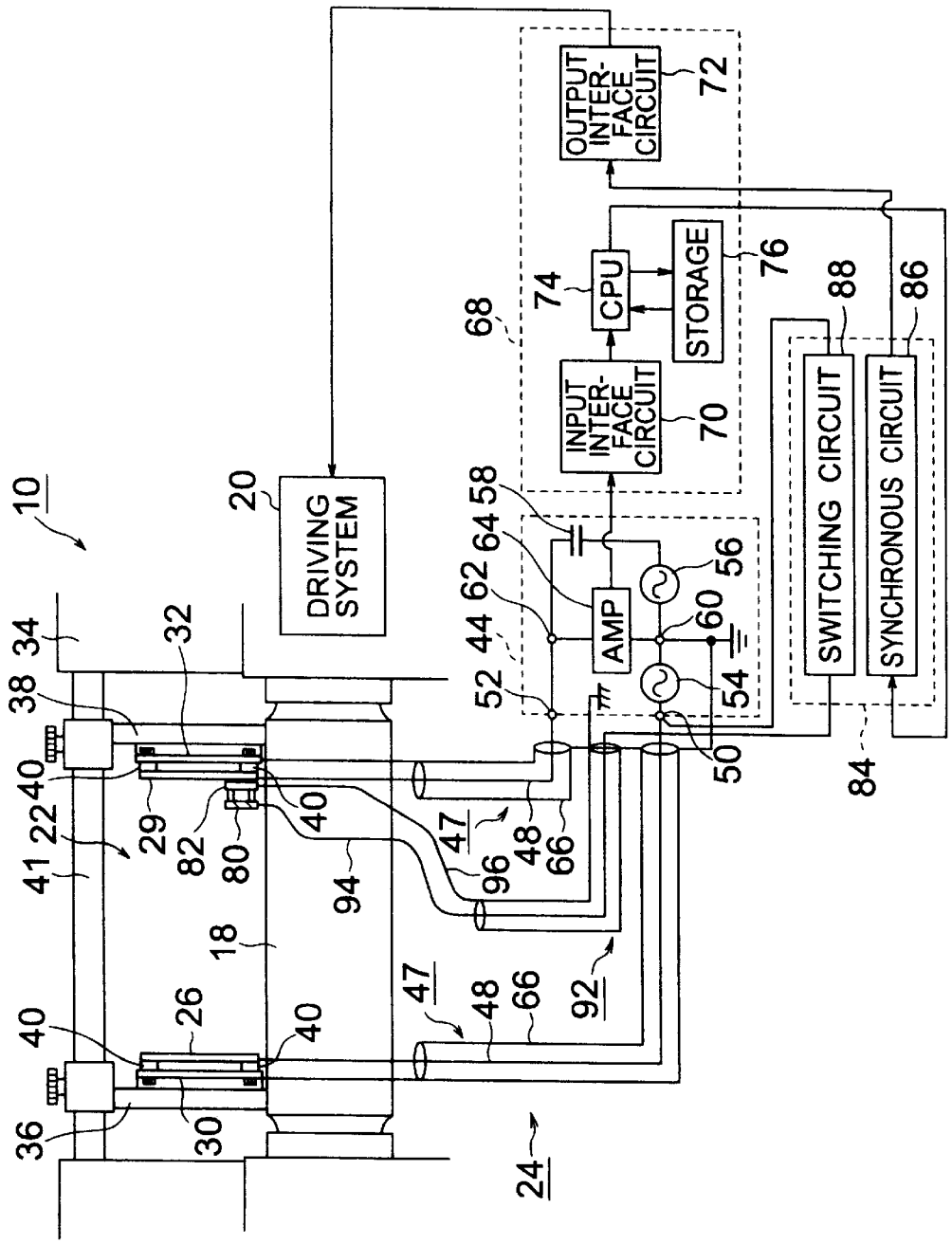
FIG. 14 is a view showing schematically a structure of a rolling machine together with a circuit configuration of the inter-electrode capacitance type sensor apparatus, the capacitance change detecting circuit and the monitoring apparatus including the auxiliary electrode plate according to the second embodiment of the invention.

Next, referring to FIGS. 13 and 14, description will turn to the sensor apparatus 22 of the inter-electrode capacitance type which is imparted with the monitoring function according to a second embodiment of the present invention.

As can be seen in the figures, an auxiliary electrode plate 80 of a small area is disposed in parallel with and in the vicinity of one of the electrode plates (the electrode plate 29 in the sensor apparatus 22 now concerned), as in the case of the ground-electrode capacitance type sensor apparatus described previously. Connected to the auxiliary electrode plate 80 is one end of a center conductor 94 of a coaxial cable 92, while the other end of the center conductor 94 is connected to an input terminal 50 of the measurement-dedicated power source 54 by way of a switching element 90 of a switching circuit 88 (see FIGS. 13 and 14). Further, an insulating material 82 for suppressing formation of short-circuit with the electrode plate 29 are electrically connected to a shield conductor 96 of the coaxial cable 92 which is connected to the ground potential internally of the capacitance change detecting circuit 44.

Figure 15:
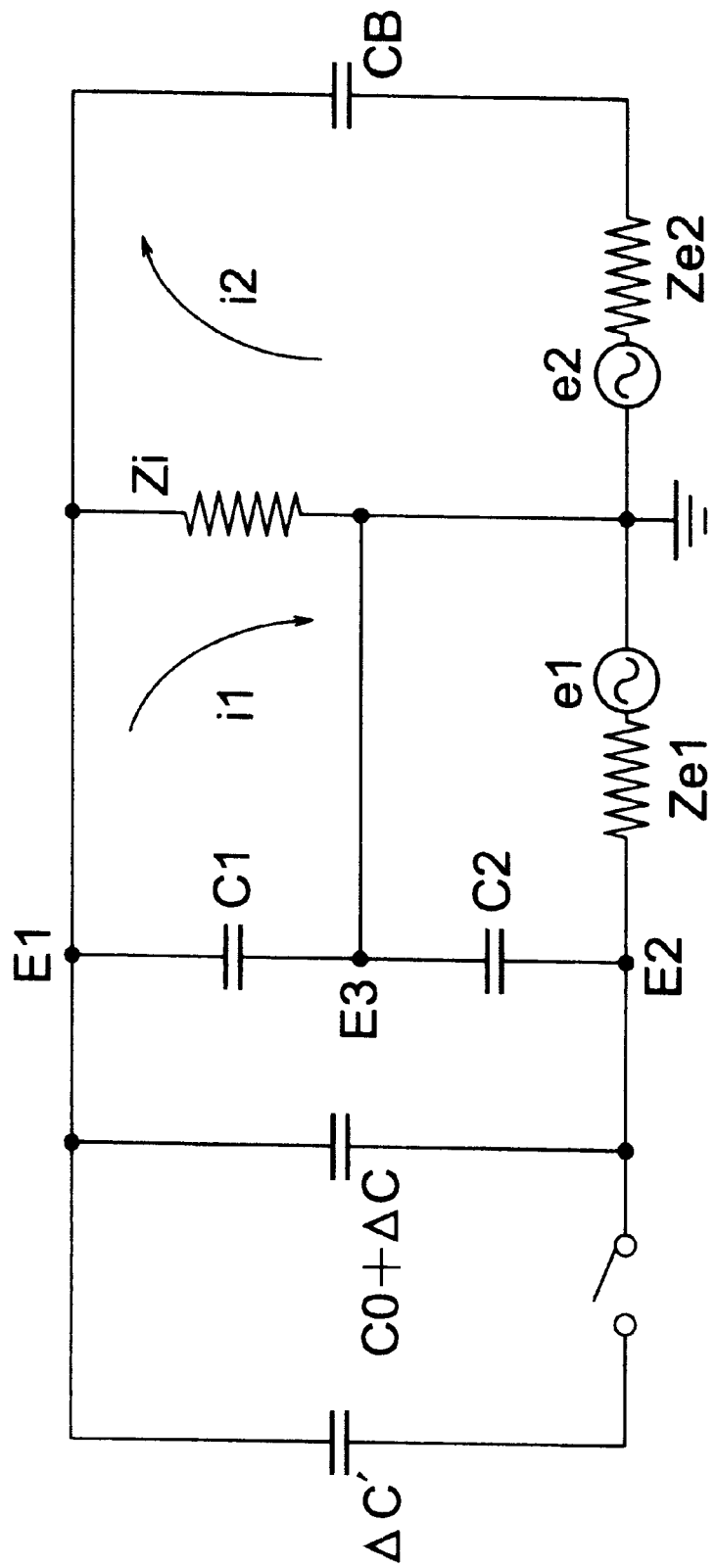
FIG. 15 is an equivalent circuit of the capacitance change detecting circuit and the monitoring apparatus including the auxiliary electrode plate according to the second embodiment of the invention.

FIG. 15 is a circuit diagram showing an equivalent circuit of the circuit arrangement described above. As can easily be appreciated from comparison with FIG. 6, the inter-electrode capacitance type sensor apparatus now under consideration differs from the equivalent circuit of the inter-electrode capacitance type sensor apparatus shown in FIG. 6 in that a series circuit of a capacitor $\Delta C'$ representing the capacitance of the auxiliary electrode plate 80 in the floating state and the switching element 90 is additionally connected in parallel to the capacitance $C_0$ of the equivalent circuit shown in FIG. 6.

When the switching element 90 is turned on, a capacitance ΔC' effective between the auxiliary electrode plate 80 and the electrode plate 29 is connected in parallel to $C_0$, whereby the capacitance $C_0$ increases by ΔC. With the capacitance increment ΔC, a detection signal is generated which is comparable to the detection signal generated upon detection of a part of the human body. On the other hand, in the state where the switching element 90 is opened (off state), the capacitance $C_0$ remains unchanged, whereby an signal comparable to that indicating no detection of the human body is outputted from the sensor apparatus.

Incidentally, it should be added that in the case of the sensor apparatus 22 of the inter-electrode capacitance type according to the instant embodiment of the invention, the central arithmetic/processing unit (CPU) 74 is disabled to output the detection signal to the output interface circuit 72 during the monitoring period TC in which the quiescent signal is generated, as illustrated in FIG. 19. With the arrangement of the inter-electrode capacitance type sensor apparatus 22 described above, normality of the sensor apparatus designated for detecting presence or absence of at least a part of the human body on the basis of the change of capacitance can periodically be monitored consecutively.

Figure 16:
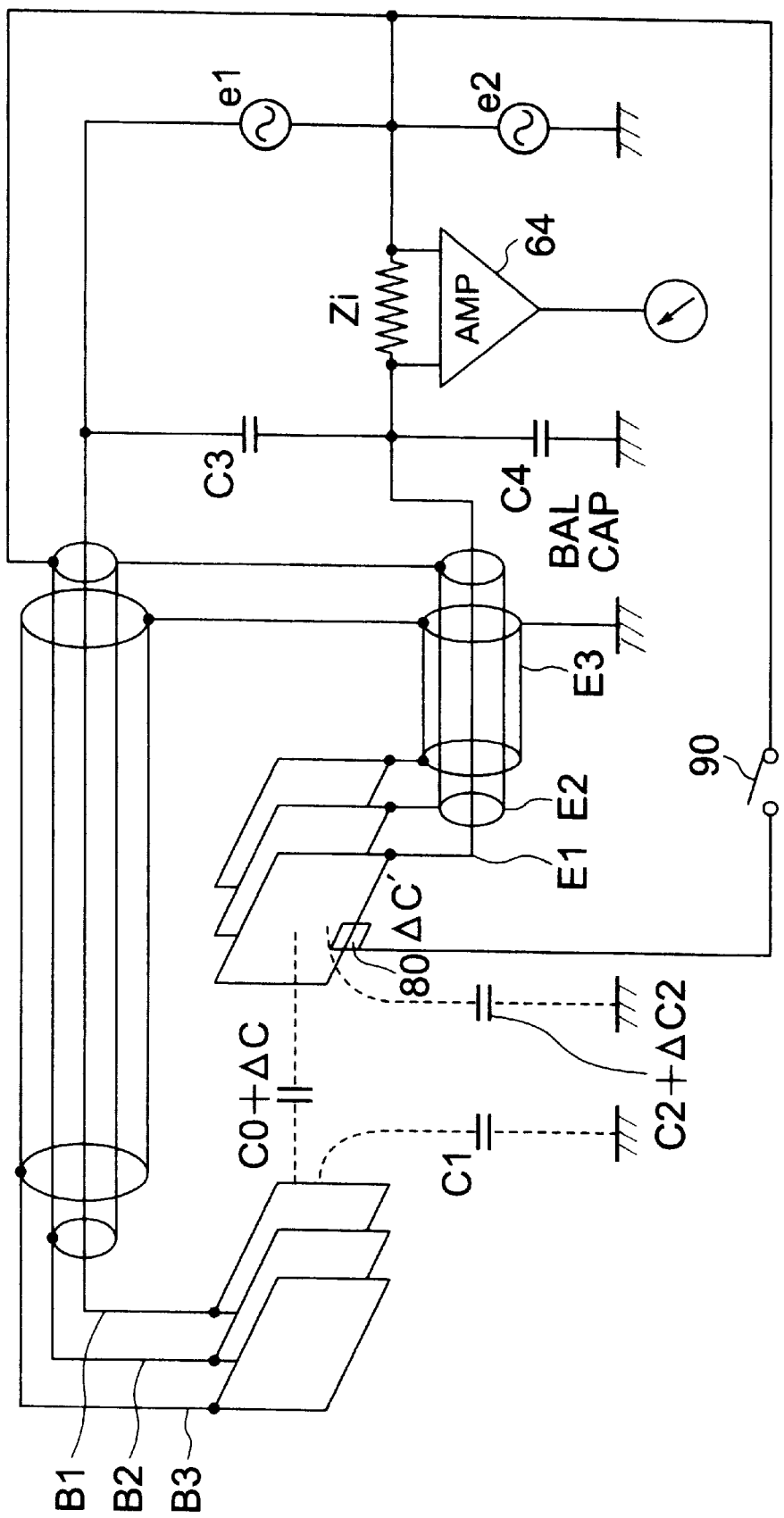
FIG. 16 is a view showing schematically structures of an inter-electrode/ground-electrode capacitance type sensor apparatus, a capacitance change detecting circuit and a monitoring circuit including an auxiliary electrode plate according to a third embodiment of the present invention.
Figure 17:
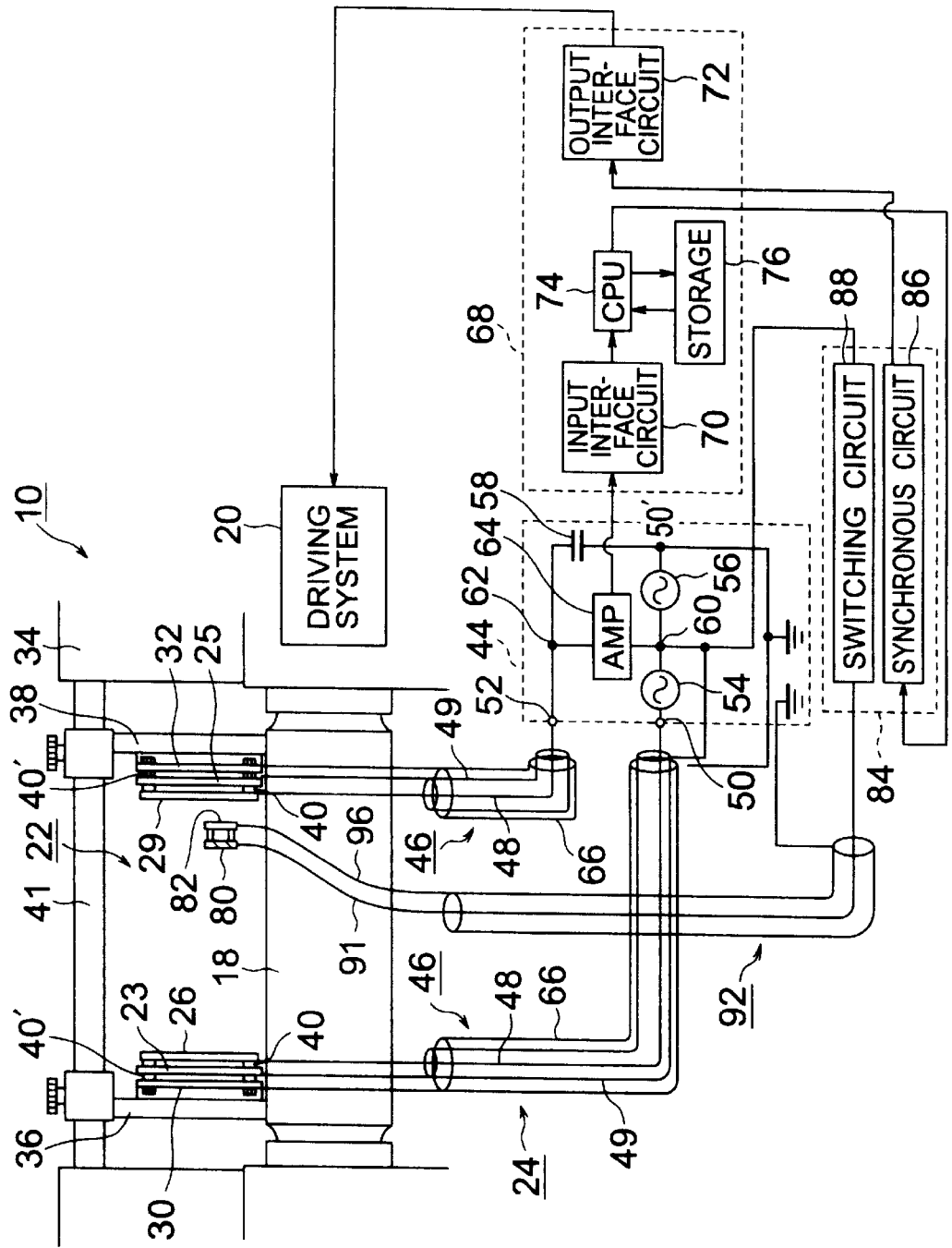
FIG. 17 is a view showing schematically a structure of a rolling machine together with a circuit configuration of the inter-electrode/ground-electrode capacitance type sensor apparatus, capacitance change detecting circuit and the monitoring apparatus including the auxiliary electrode plate according to the third embodiment of the invention.

Next, description will be directed to a sensor apparatus 22 of the inter-electrode/ground-electrode capacitance type which is imparted with the monitoring function according to a third embodiment of the present invention. FIGS. 16 and 17 are views showing schematically a structure of the inter-electrode/ground-electrode capacitance type sensor apparatus having the monitoring function according to the instant embodiment of the present invention. Referring to figures, an auxiliary electrode plate 80 of a small area is disposed in parallel and in opposition to the electrode plate 29 closely with a short distance therebetween, wherein the auxiliary electrode plate 80 is adapted to be connected to the guard plates 23; 25 so that the capacitance change detecting circuit 44 can generate an output signal similar to that generated upon detection of access of the human body when the auxiliary electrode plate 80 is electrically connected to the guard plates 23; 25. As can be seen in FIG. 17, an insulating material 82 is disposed on one surface of the auxiliary electrode plate 80 which faces toward the electrode plate 29. The insulating material 82 serves for preventing occurrence of a short-circuit event between the auxiliary electrode plate 80 and the electrode plate 29.

Disposed between the central arithmetic/processing unit 74 of the control unit 68 and the output interface circuit 72 is a control circuit 84 which is comprised of a synchronous circuit 86 and a switching circuit 88. By turning on or off a switching element 90 (see FIG. 16) incorporated in the switching circuit 88, the auxiliary electrode plate 80 is electrically connected to the guard plates 23; 25 or set to the floating state.

The switching element 90 may be so designed as to be turned on (closed) during a period, for example, on the order of milliseconds per second periodically in a repetitive manner so that the auxiliary electrode plate 80 is forced to be electrically connected to the guard plates every second for the purpose of monitoring whether the sensor apparatus 22 is operating normally.

In more concrete, one terminal of the switching element 90 of the switching circuit 88 is electrically connected to the auxiliary electrode plate 80 by way of a center conductor 91 of a coaxial cable 92 while the other terminal of the switching element 90 is electrically connected to one ends of inner conductors 49 of the double-layer coaxial cables 46, respectively, the other ends of the inner conductors 49 being electrically connected to the guard plates 23 and 25, respectively, as can be seen in FIG. 17. Further, the insulating material 82 is electrically connected to the shield conductor 96 serving as the outer conductor of the coaxial cable 92, wherein the shield conductor 96 is grounded internally of the control circuit 84. Further, the outer conductors of the double-layer coaxial cables 46 are connected to the shielding plates 30 and 32, respectively, and grounded internally of the capacitance change detecting circuit 44.

The synchronous circuit 86 incorporated in the control circuit 84 is provided between the central arithmetic/processing unit (CPU) 74 and the output interface circuit 72. Every time the switching element 90 is turned on or closed, the detection signal outputted from the central arithmetic/processing unit 74 is suppressed from being supplied to the output inter-face circuit 72 so that inadvertent shutdown of the driving system 20 is not brought about by the monitoring operation.

Figure 18:
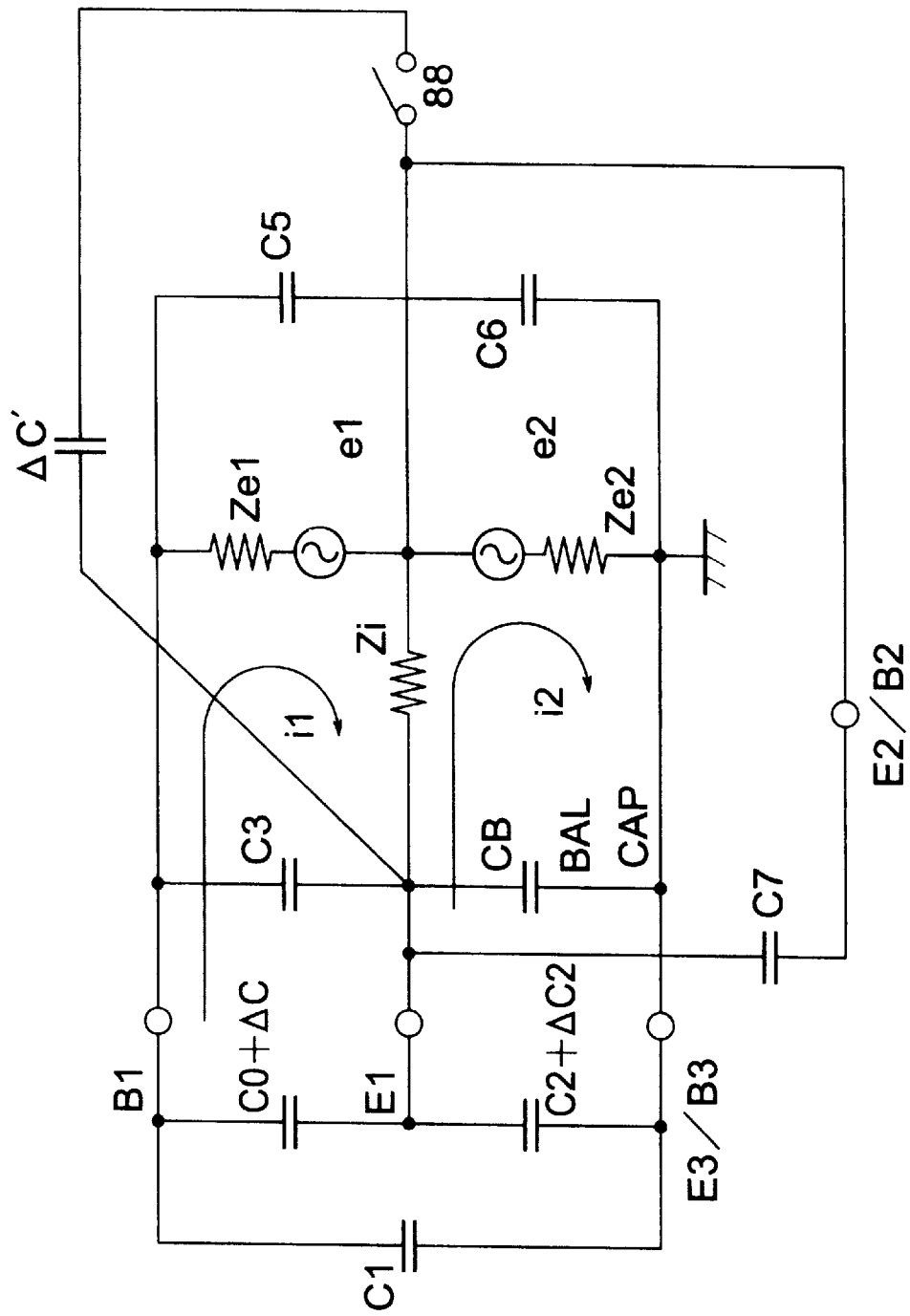
FIG. 18 is an equivalent circuit of the capacitance change detecting circuit and the monitoring apparatus including the auxiliary electrode plate according to the third embodiment of the invention.

FIG. 18 is an equivalent circuit diagram of the capacitance change detecting circuit imparted with the monitoring function described above. As can be seen from comparison of FIG. 18 with FIG. 9, the circuit configuration shown in FIG. 18 differs from that shown in FIG. 9 in the respect that a series circuit of the switching element 90 and a capacitor ΔC' representing the capacitance due to the auxiliary electrode plate 80 in the floating state is connected in parallel with the capacitor $C_7$.

When the switching element 90 is turned off or opened under the control of the central arithmetic/processing unit 74, the auxiliary electrode plate 80 assumes the electrically floating state, as a result of which the capacitance ΔC formed between the auxiliary electrode plate 80 and the guard plate 25 is cleared from the state electrically connected in parallel to the capacitor $C_0$, resulting in that the capacitance $C_0$ is increased by a proportion corresponding to the capacitance ΔC with the capacitance $C_2$ being increased by a proportion corresponding to capacitance $\Delta C_2$, which means that change of the capacitance comparable to that brought about upon detection of the human body does occur, whereby a substantially same detection signal as the human body detection signal is outputted.

At this juncture, it should be mentioned in conjunction with the circuit shown in FIG. 18 that the capacitance ΔC' making appearance between the auxiliary electrode plate 80 and the guard plate 25 when the switching element 90 is turned on or closed is connected in parallel to the capacitor $C_7$. Accordingly, in the open or off state of the switching element 90, the signal comparable to that indicating absence of the human body is generated.

When the detection signal is generated upon closing of the switching element 90, this indicates that the sensor apparatus 22 is operating normally. Accordingly, a corresponding message may visibly be displayed to be readily recognizable by the operator. Similarly, unless the sensor apparatus 22 is normal, a message to such effect may be generated for calling attention of the operator working in the neighborhood. In this way, the sensor apparatus 22 can constantly be monitored for making sure that the sensor apparatus 22 is operating normally.

FIG. 19 is a timing chart for illustrating the operations described above. In this figure, the output voltage of the output power amplifier 64 shown in FIG. 16 is illustrated at (a). Unless a part of the human body such as operator's hand is detected, the output voltage of the output power amplifier 64 assumes a voltage level of e.g. +24 V. On the other hand, when the hand is detected, the output voltage assumes a voltage level of e.g. 0 to +12 V to be outputted as the safety securing information signal.

Shown at (b) in FIG. 19 is a trigger signal issued from the central arithmetic/processing unit 74, which is then followed by a check signal for opening or turning off the switching element 90 incorporated in the switching circuit 88, which involves the floating state of the auxiliary electrode plate 80. Subsequently, the switching element 90 is turned on, whereupon transition is made to the ordinary capacitance change sensing or detecting state.

During a monitoring period TC extending from the leading edge of the trigger pulse to the trailing edge of the check signal, the quiescent signal is outputted, as illustrated at (c) in FIG. 19, for the purpose of interrupting the detection signal outputted to the output interface circuit 72 during the monitoring period (TC) to thereby prevent inadvertent shutdown of the rolling machine by the driving system 20.

Incidentally, the monitoring period TC shown in FIG. 19 may be set to be 30 mS, while the ordinary sensing or detecting periods TS may be set to be e.g. one second. Of course, this is only by way of example. The time durations of these period can be set rather arbitrarily and altered appropriately or empirically.

In conjunction with the processing of the voltage signal outputted from the output power amplifier 64 such as shown in FIGS. 10 and 13, it is preferred to employ a window comparator in view of the fact that the output voltage signal which assumes a level within a voltage range of e.g. zero to 12 volts is outputted from the output power amplifier 64 as the safety securing information when a hand of the human body or the like is detected. By using the window comparator for processing the variable output voltage of the output power amplifier 64, detection of a part of the human body or the like can be realized with high reliability regardless of variation of the output voltage signal of the output power amplifier 64. Besides, by employing the window comparator, the sensor apparatus 22 according to the present invention can be implemented at low cost.

It should however be mentioned that the present invention is never limited to the use of such window comparator for the output signal processing. To this end, there may be employed any other appropriate circuit or device such as an AND gate, a self-holding circuit, an on-delay circuit, a rectifier circuit, an nalogue amplifier, an output amplifier, a fail-safe ntegrated circuit designed for the control purpose and hose output becomes zero upon occurrence of trouble, or an enforcive guide type safety relay.

Furthermore, by providing the auxiliary electrode plate 80 for monitoring constantly or periodically the normality of the sensor apparatuses 22 of the ground-electrode capacitance type, the inter-electrode capacitance type and the inter-electrode/ground-electrode capacitance type according to the teachings of the present invention, not only the circuit troubles or faults such as disconnection, destruction or detachment of the electrodes but also the fault of the sensor apparatus itself such as power supply interruption and the like can be detected easily.

Furthermore, because the sensor apparatus 22 operates on the basis of the electrostatic capacitance, erroneous operations of the sensor apparatus 22 under the influence of environmental factors such as electromagnetic waves, abnormal ambient temperature and others can be detected. In other words, although the sensor apparatus equipped with a so-called fail-safe circuit can monitor only the occurrence of trouble or fault in the sensor apparatus, the sensor apparatus incarnating the teachings of the present invention is capable of performing the monitoring operation not only for occurrence of trouble in the sensor apparatus but also erroneous operation of the sensor brought about under the influence of the ambient or environmental factors.

It goes without saying that upon detection of abnormality of the sensor apparatus 22 by the monitoring system inclusive of the auxiliary electrode, operation of the driving system 20 is caused to stop by the control unit 68.

In the foregoing description of the preferred embodiments of the present invention, it has been presumed that the present invention is applied to the rolling mills or machines. It should however be appreciated that the applicability of the present invention is never restricted to the rolling machines but the invention can find application to any species of apparatus or machine which has the area dangerous or risky for operators or workers such as a space for accommodating the driving mechanism. By way of example, as the machines to which the sensor apparatus 22 of the ground-electrode capacitance type according to the present invention can be applied, there may be mentioned a sheet inverting apparatus designed for rolling a plate or film of resin or the like discharged from an extruder with three reduction rolls, a sheet windup apparatus for receiving a film strip of resin or the like discharged from an extruder while cutting the lateral edge portions by means of film cutters, a band saw apparatus for cutting metal blocks, resin blocks, timbers or the like by means of a rotatory saw band, a roll mixer for rubber pieces or the like charged manually onto mixing rolls, and so forth.

Further, the sensor apparatus 22 of the inter-electrode capacitance type can find application to a sheet windup apparatus for receiving a film sheet or plate of resin discharged from an extruder, a heavy feeder for feeding pulverulent material, pellets or the like by means of rotary mixing blades, a Banburry mixer with two counterrotating rotors for doughy materials such as plastics and rubbers, a movable machine such as a robot or the like equipped with a protection barrier a portion of which is openable for the purpose of transportation of parts, materials for supply, processed or treater parts, inspection/maintenance of the machine, etc.

In the light of the above, the term "machine" used in the description of the specification and claims should be so interpreted as to encompass a variety of apparatuses, machines, equipment, instruments, or the like which has an area or region risky for access of a dielectric member such as a part of the human body or the like.

Furthermore, it goes without saying that in the sensor apparatuses 22 of the ground-electrode capacitance type and the inter-electrode capacitance type, the shapes and the sizes or dimensions of the individual members such as the electrode plates, reduction rolls, guard plates, shielding plates and others may be modified appropriately.

As will now be appreciated from the foregoing description, by virtue of the structure of the safety apparatus including the sensor apparatus according to the present invention in which the auxiliary electrode plate disposed in opposition to a portion of the intrinsic electrode plate is periodically connected to the capacitance change detecting circuit for the purpose of monitoring steadily and periodically the normality of the capacitance change detecting sensor apparatus, it is possible to secure higher safety for the operators or workers.

Besides, the safety apparatus according to the present invention can monitor not only the fault or trouble of the sensor apparatus but also erroneous operation thereof brought about under the influence of the environmental factors such as the electromagnetic waves, the ambient temperature and the like.

Additionally, in the safety securing apparatus according to the invention, no electric field is formed on the rear surface of the electrode plate by providing the shielding plate at the rear side thereof. Thus, presence of a part of the human body or the like only in the area or space defines between the electrode plate and the machine or between the paired electrode plates can be detected, which makes it possible to diminish significantly the erroneous detection, to another advantage.

Many features and advantages of the present invention are apparent from the detailed description and thus it is intended by the appended claims to cover all such features and advantages of the system which fall within the true spirit and scope of the invention. Further, since numerous modifications and combinations will readily occur to those skilled in the art, it is not intended to limit the invention to the exact construction and operation illustrated and described.

Accordingly, all suitable modifications and equivalents may be resorted to, falling within the spirit and scope of the invention.

What is claimed is:

1. A sensor apparatus for a machine grounded electrically, comprising:

at least one electrode plate disposed relative to said machine with a predetermined space from said machine;

an auxiliary electrode disposed in opposition to a portion of said at least one electrode plate;

a capacitance change detecting circuit for detecting whether a predetermined dielectric exists or not within said space on the basis of change of capacitance between said at least one electrode plate and said machine; and monitor for monitoring normality of dielectric detecting operation of said sensor apparatus by electrically connecting periodically said auxiliary electrode plate to said capacitance change detecting circuit.

2. A sensor apparatus according to claim 1, further comprising:

a guard plate disposed at a rear side of said electrode plate; and a shielding plate disposed at a rear side of said guard plate, said shielding plate being electrically grounded.

3. A safety apparatus for detecting entrance of at least a part of human body in a predetermined area of a machine grounded electrically, to thereby actuate safety securing means, said safety apparatus, comprising:

at least one electrode plate disposed relative to said machine with said area being interposed between said machine and said electrode plate;

an auxiliary electrode disposed in opposition to a portion of said at least one electrode plate;

a capacitance change detecting circuit for detecting whether a part of the human body exists or not in said area on the basis of change of capacitance between said at least one electrode plate and said machine; and monitor for monitoring normality of human body detecting operation of said sensor apparatus by electrically connecting periodically said auxiliary electrode to said capacitance change detecting circuit.

4. A sensor apparatus, comprising:

a pair of electrode plates disposed in opposition to each other with a predetermined space being interposed therebetween;

an auxiliary electrode disposed in opposition to a portion of either one of said electrode plates;

a capacitance change detecting circuit for detecting whether a predetermined dielectric exists or not within said space on the basis of change of capacitance between said pair of electrode plates; and monitor for monitoring normality of dielectric detecting operation of said sensor apparatus by electrically connecting periodically said auxiliary electrode to said capacitance change detecting circuit.

5. A sensor apparatus according to claim 4, further comprising:

a pair of shielding plates grounded electrically and disposed in opposition to said pair of electrode plates at sides opposite to said space, respectively.

6. A safety apparatus for detecting entrance of at least a part of human body in a predetermined area of a machine grounded electrically, to thereby actuate safety securing means, said safety apparatus, comprising:

a pair of electrode plates disposed in opposition to each other with said area being interposed between said pair of electrode plates;

an auxiliary electrode disposed in opposition to a portion of either one of said electrode plates;

a capacitance change detecting circuit for detecting whether at least a part of the human body exists or not in said area on the basis of change of capacitance between said pair of electrode plates; and monitor for monitoring normality of human body detecting operation of said sensor apparatus by electrically connecting periodically said auxiliary electrode to said capacitance change detecting circuit.

* * * * *